(12) United States Patent
Rusu et al.

(10) Patent No.: US 11,966,090 B2
(45) Date of Patent: Apr. 23, 2024

(54) HETEROGENEOUS PACKAGING INTEGRATION OF PHOTONIC AND ELECTRONIC ELEMENTS

(71) Applicant: Taiwan Semiconductor Manufacturing Co., Ltd., Hsin-Chu (TW)

(72) Inventors: Stefan Rusu, Hsin-Chu (TW); Wei-Wei Song, Sunnyvale, CA (US); Mohammed Rabiul Islam, Austin, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 257 days.

(21) Appl. No.: 17/191,477

(22) Filed: Mar. 3, 2021

(65) Prior Publication Data

US 2022/0283387 A1    Sep. 8, 2022

(51) Int. Cl.
| | | |
|---|---|---|
| *G02B 6/42* | (2006.01) | |
| *H01L 23/367* | (2006.01) | |
| *H01L 25/00* | (2006.01) | |
| *H01L 25/065* | (2023.01) | |
| *H01L 25/18* | (2023.01) | |
| *H01L 23/48* | (2006.01) | |

(52) U.S. Cl.
CPC ........... *G02B 6/425* (2013.01); *G02B 6/4268* (2013.01); *H01L 23/3675* (2013.01); *H01L 25/0652* (2013.01); *H01L 25/18* (2013.01); *H01L 25/50* (2013.01); *H01L 23/481* (2013.01)

(58) Field of Classification Search
CPC ... G02B 6/425; G02B 6/4268; H01L 23/3675; H01L 23/481; H01L 25/0652; H01L 25/18; H01L 25/50
See application file for complete search history.

(56) References Cited

U.S. PATENT DOCUMENTS

| | | | | |
|---|---|---|---|---|
| 5,420,722 | A * | 5/1995 | Bielak | G02B 6/4204 359/708 |
| 6,095,697 | A * | 8/2000 | Lehman | G02B 6/423 385/91 |
| 6,450,699 | B1 * | 9/2002 | Murali | H01L 24/73 385/88 |
| 6,866,426 | B1 * | 3/2005 | Steinberg | G02B 6/423 385/83 |
| 6,985,506 | B2 * | 1/2006 | Lissotschenko | H01S 5/02326 372/101 |
| 7,062,144 | B2 * | 6/2006 | Hwang | G02B 6/423 385/139 |
| 7,239,767 | B2 * | 7/2007 | Kim | G02B 6/42 385/32 |
| 7,271,461 | B2 * | 9/2007 | Dutta | H01L 24/17 257/432 |
| 7,373,033 | B2 * | 5/2008 | Lu | G02B 6/4246 257/432 |

(Continued)

*Primary Examiner* — Peter Radkowski
(74) *Attorney, Agent, or Firm* — Duane Morris LLP

(57) ABSTRACT

Heterogeneous packaging integration of photonic and electronic elements is described herein. In one embodiment, a disclosed package includes: a package substrate; a first layer comprising an electronic die on the package substrate; and a second layer comprising a photonic die. The second layer is bonded onto the first layer such that the photonic die is bonded onto the electronic die.

20 Claims, 29 Drawing Sheets

(56) References Cited

U.S. PATENT DOCUMENTS

| | | | | |
|---|---|---|---|---|
| 7,411,281 B2* | 8/2008 | Zhang | H01L 23/36 | 257/E23.101 |
| 7,595,227 B2* | 9/2009 | Zhang | H01L 23/49816 | 438/122 |
| 7,703,991 B2* | 4/2010 | Lu | G02B 6/4292 | 385/88 |
| 8,111,730 B2* | 2/2012 | Budd | H01L 27/1446 | 372/50.23 |
| 8,227,904 B2* | 7/2012 | Braunisch | H01L 24/14 | 257/777 |
| 8,498,504 B2* | 7/2013 | Matsubara | H05K 1/0274 | 385/52 |
| 8,748,797 B1* | 6/2014 | Decker | H03F 3/08 | 250/214 R |
| 9,041,015 B2* | 5/2015 | Lai | G02B 6/12004 | 257/81 |
| 9,229,169 B2* | 1/2016 | Doany | H01L 21/302 | |
| 9,570,883 B2* | 2/2017 | Zarbock | G02B 6/4269 | |
| 9,829,626 B2* | 11/2017 | Shubin | G02B 6/1228 | |
| 10,461,022 B2* | 10/2019 | Wu | H01L 24/09 | |
| 10,598,875 B2* | 3/2020 | Xie | G02B 6/3897 | |
| 10,985,118 B2* | 4/2021 | Koren | H01L 23/3672 | |
| 11,054,597 B2* | 7/2021 | Raghunathan | G02B 6/428 | |
| 11,209,598 B2* | 12/2021 | Janta-Polczynski | G02B 6/30 | |
| 2002/0076170 A1* | 6/2002 | Murali | H01L 24/73 | 385/88 |
| 2004/0258124 A1* | 12/2004 | Lissotschenko | H01S 5/4025 | 372/75 |
| 2005/0100264 A1* | 5/2005 | Kim | G02B 6/42 | 385/14 |
| 2005/0224946 A1* | 10/2005 | Dutta | G02B 6/4257 | 257/686 |
| 2005/0280141 A1* | 12/2005 | Zhang | H01L 23/3128 | 257/E23.101 |
| 2006/0056765 A1* | 3/2006 | Hwang | G02B 6/43 | 385/39 |
| 2006/0251360 A1* | 11/2006 | Lu | G02B 6/4292 | 385/88 |
| 2007/0297713 A1* | 12/2007 | Lu | G02B 6/4246 | 385/14 |
| 2008/0182364 A1* | 7/2008 | Zhang | H01L 23/3128 | 257/E23.101 |
| 2010/0327424 A1* | 12/2010 | Braunisch | H01L 24/73 | 257/692 |
| 2011/0019960 A1* | 1/2011 | Matsubara | H05K 1/0274 | 385/14 |
| 2011/0044367 A1* | 2/2011 | Budd | H01L 27/1446 | 257/E31.127 |
| 2013/0084039 A1* | 4/2013 | Doany | H01L 21/302 | 438/31 |
| 2013/0230274 A1* | 9/2013 | Fish | G02B 6/305 | 385/14 |
| 2014/0029639 A1* | 1/2014 | Zarbock | G02B 6/4269 | 372/50.1 |
| 2014/0269804 A1* | 9/2014 | Lai | H01S 5/02355 | 372/50.21 |
| 2017/0199328 A1* | 7/2017 | Shubin | G02B 6/1228 | |
| 2019/0057932 A1* | 2/2019 | Wu | H01L 23/04 | |
| 2019/0137706 A1* | 5/2019 | Xie | G02B 6/4202 | |
| 2019/0317287 A1* | 10/2019 | Raghunathan | G02B 6/4274 | |
| 2020/0273822 A1* | 8/2020 | Koren | H01L 25/18 | |
| 2020/0279840 A1* | 9/2020 | Janta-Polczynski | G02B 6/30 | |

* cited by examiner

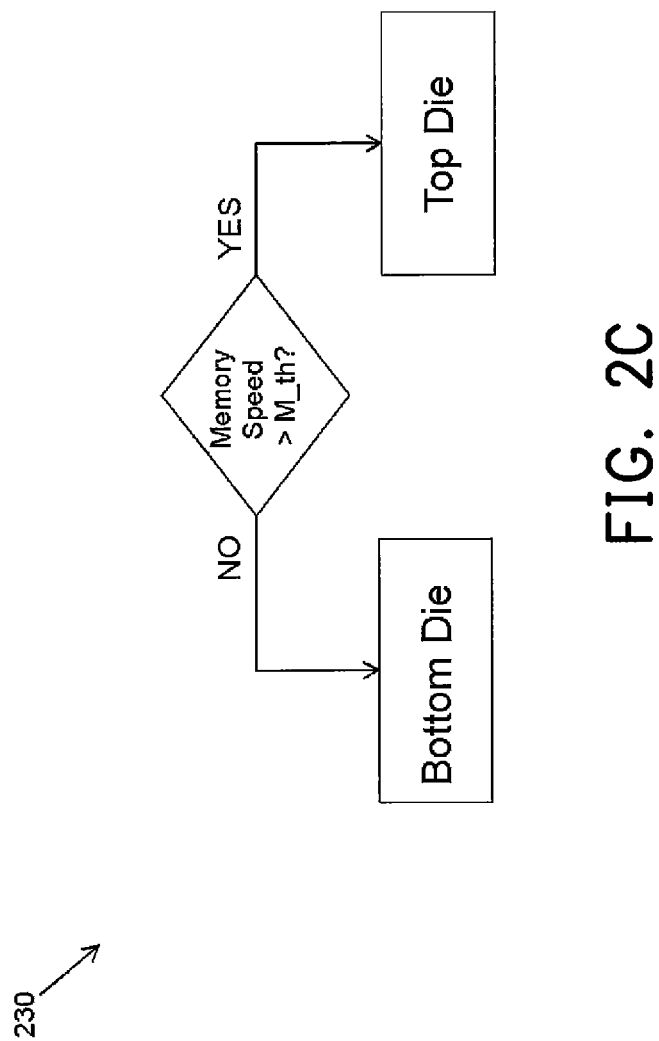

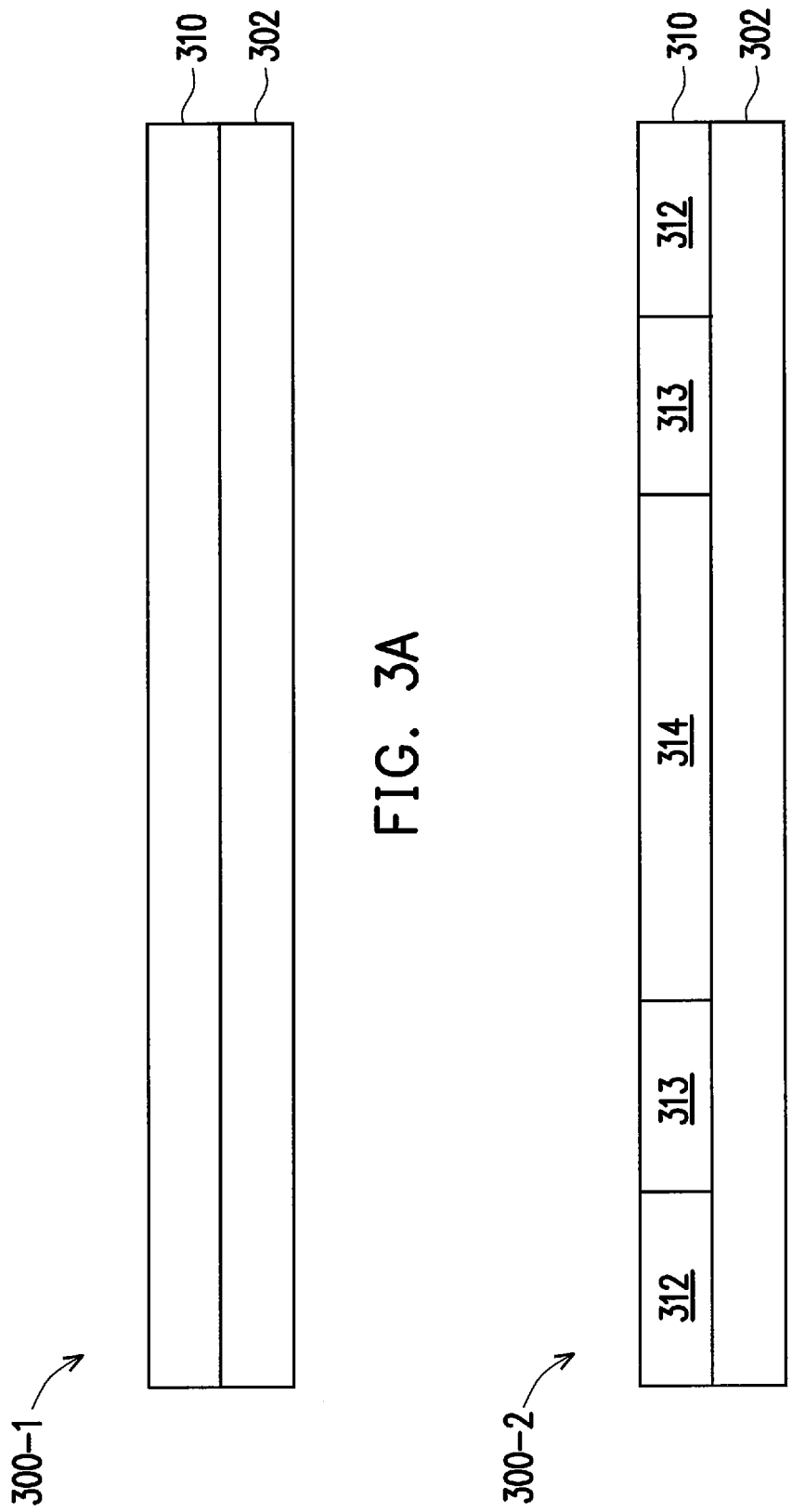

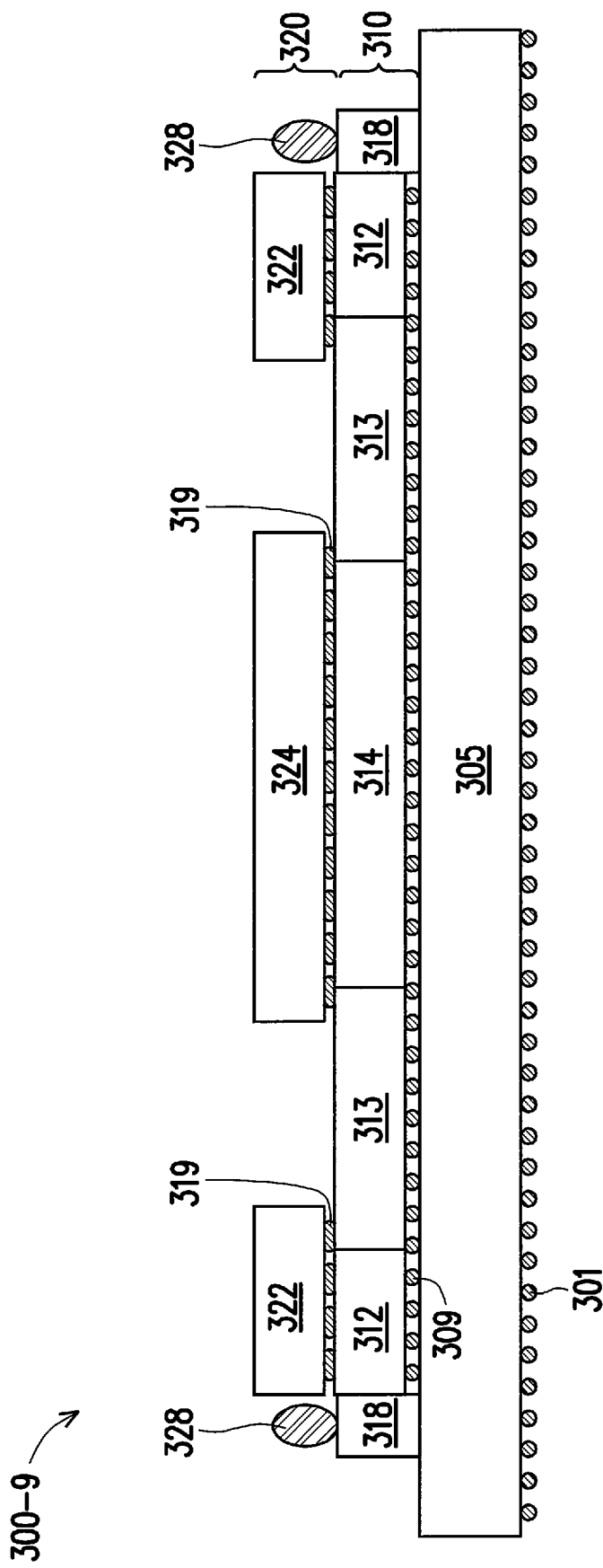

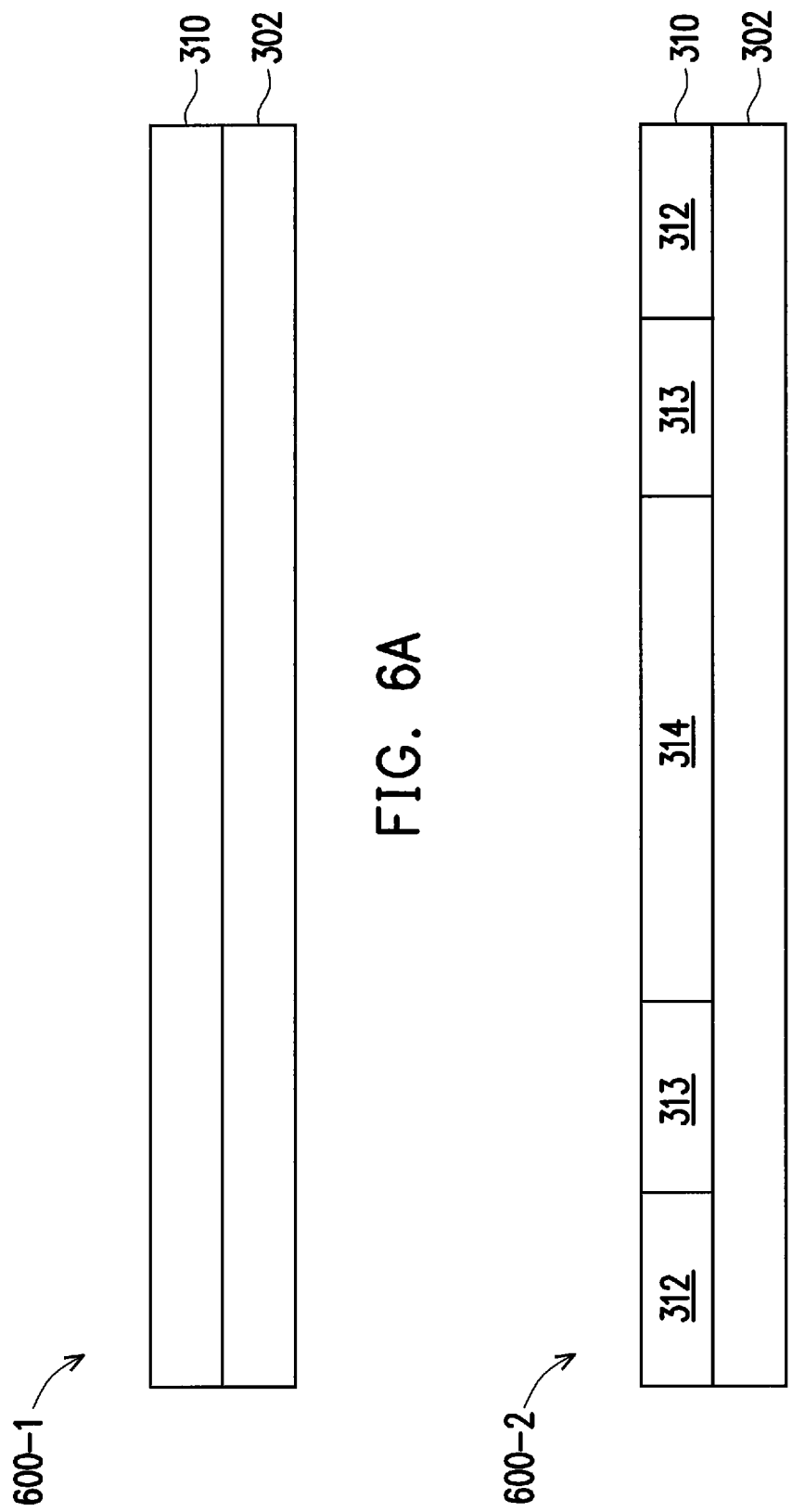

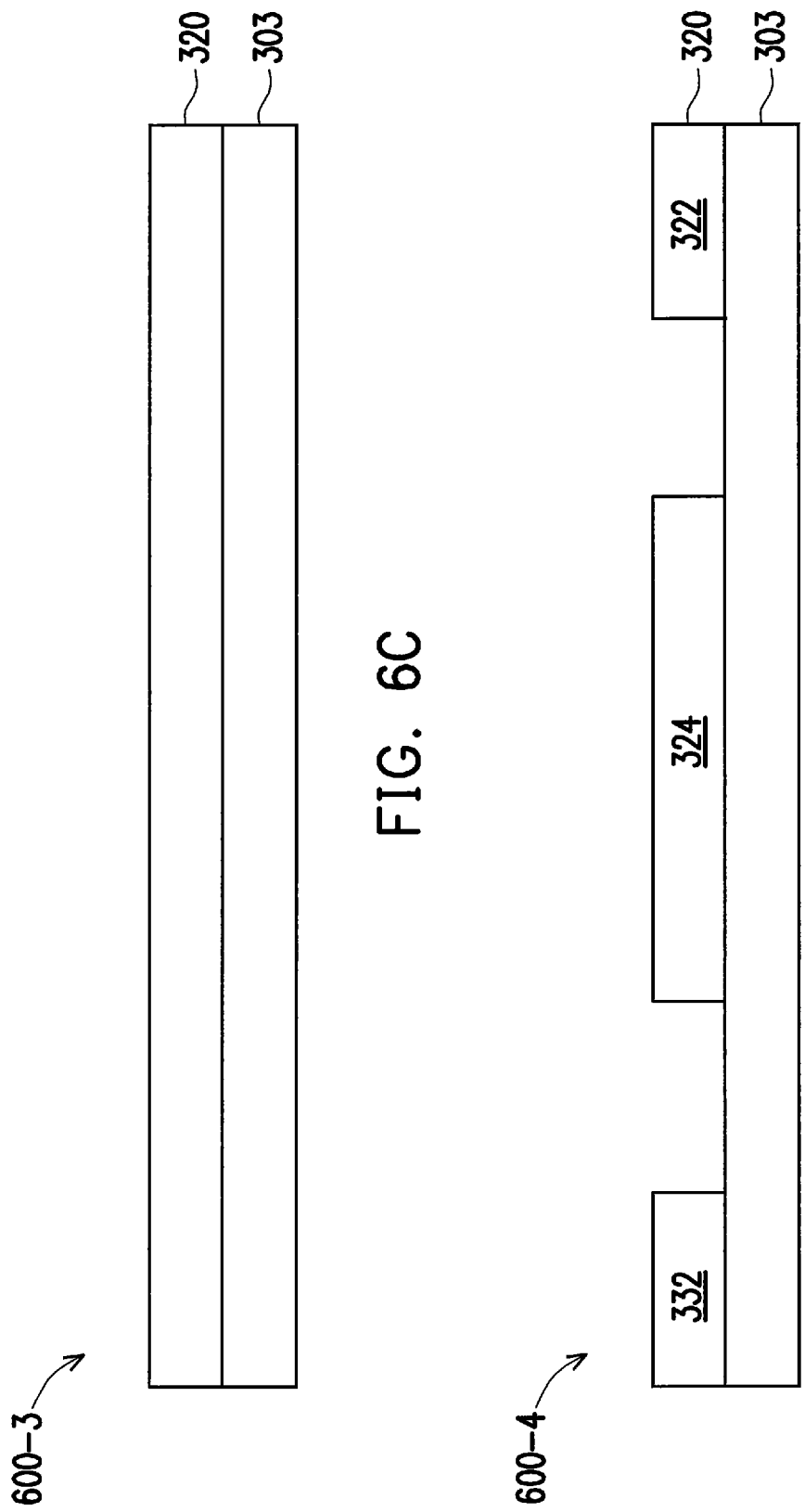

HETEROGENEOUS PACKAGING INTEGRATION OF PHOTONIC AND ELECTRONIC ELEMENTS

BACKGROUND

Photonic integrated circuits (PICs), e.g. high performance servers, utilize photonic and electronic elements to implement various functions with respect to data processing and computing. While the electronic elements may include central processing unit (CPU), graphics processing unit (GPU), I/O buffers, etc.; the photonic elements may include waveguide, optical amplifier, modulator, photodiode, and other elements for generating, emitting, transmitting, modulating, signal processing, amplifying, and/or detecting light. In a PIC, a photonic die including photonic elements is often driven by an electronic die including electronic elements.

In an existing PIC, photonic dies and electronic dies are integrated on a board, e.g. a printed circuit board (PCB). As such, a computing or processing element in an electronic die has to go through wires and devices on the board to communicate with a photonic die; and there is no direct mechanism to drive a modulator in a photonic die by an electronic die. This causes a larger integration area, a higher latency, a higher power consumption, and a lower bandwidth for signal processing and communications in the PIC.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

FIG. 213 illustrates another exemplary decision criterion on die selection for a photonic or electronic element, in accordance with some embodiments of the present disclosure.

FIGS. 3A-3L illustrate cross-sectional views of an exemplary IC package at various stages of a fabrication process, in accordance with some embodiments of the present disclosure.

FIGS. 6A-6L illustrate cross-sectional views of another exemplary IC package at various stages of a fabrication process, in accordance with some embodiments of the present disclosure.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present teaching discloses an integration of high performance computing (HPC) processors, photonic dies, and electronic dies using heterogeneous three-dimensional (3D) package solutions. Compute dies with advanced process nodes and photonic dies are in a top layer on top of the assembly. The bottom layer includes mature nodes, e.g. input/output (I/O) buffers, memory controller, peripheral component interconnect express (PCIe) controller, and other chipset function nodes. One or more electronic dies with analog functionality are in the bottom layer as well, serving as interfaces and/or drivers for the photonic dies. This enables a close proximity of compute and photonic dies within the package.

The disclosed method and package can be applied to any application with 3D chipset integration and high bandwidth data transfer. For example, the disclosed integration can be well applied to next generation servers, which have a high bandwidth data transfer requirement. The close integration of photonic die with the compute die enables a low power consumption and a high transmission bandwidth, e.g. for data transmission between servers connected by fibers.

In one embodiment, the package integrates heterogeneous processor elements and photonic elements with a direct hybrid bonding. The processor elements may include, e.g. central processing unit (CPU), graphics processing unit (GPU), field programmable gate array (FPGA), machine learning engines, etc. The photonic elements may include modulators, photodiodes, waveguides, optical amplifiers, etc. Photonic dies and computing elements with advanced nodes are on top layer of the heterogeneous stack; electronic dies (or photonic interface dies) with analog and chipset functions and mature process nodes are on the bottom layer of the heterogeneous stack. The direct hybrid bonding of the top and bottom layers enables a face-to-face stacking, which causes a high bandwidth communication between processor elements and photonic elements, and enables a simple low-power signaling between dies. In addition, the segmentation of computing and chipset/analog functionalities between advanced and mature nodes can save cost of the IC package.

Figure 1A:
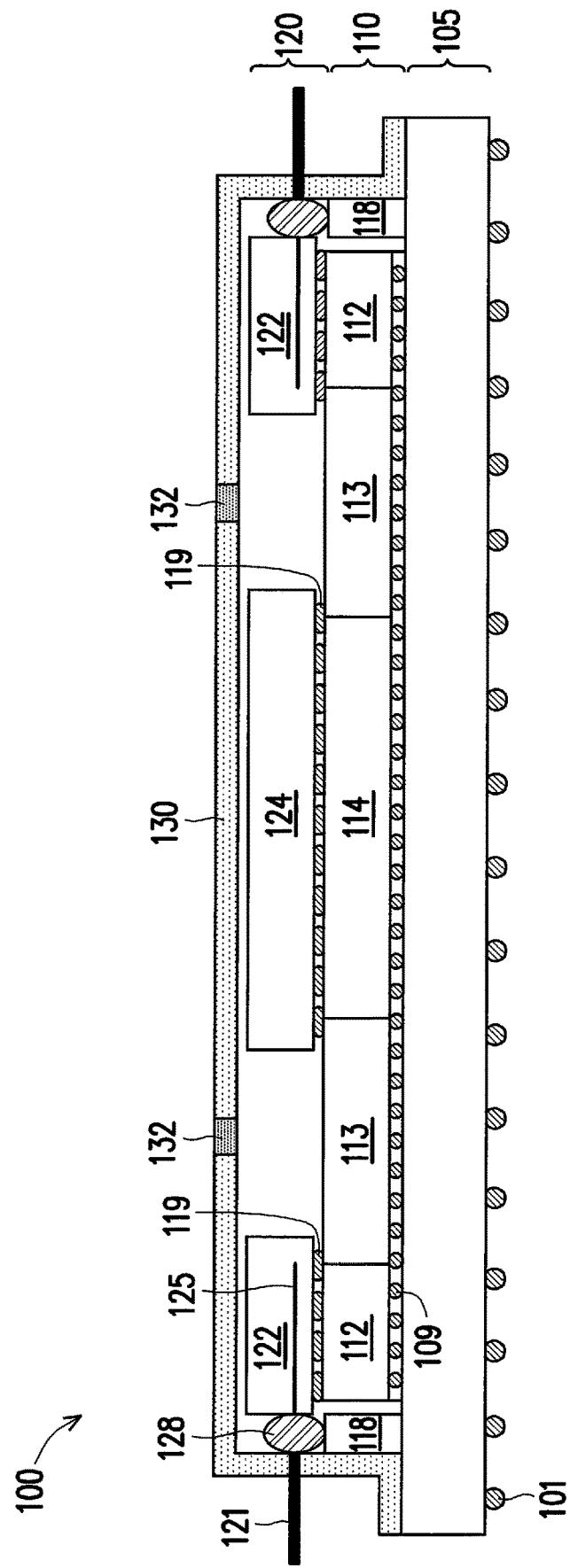
FIG. 1A illustrates a cross-sectional view of an exemplary integrated circuit (IC) package, in accordance with some embodiments of present disclosure.

FIG. 1A illustrates a cross-sectional view of an exemplary integrated circuit (IC) package 100, in accordance with some embodiments of present disclosure. It is noted that the package 100 is merely an example, and is not intended to limit the present disclosure. Accordingly, it is understood that additional functional blocks may be provided in or coupled to the package 100 of FIG. 1A, and that some other functional blocks may only be briefly described herein.

Referring to FIG. 1A, the package 100 comprises a package substrate 105, a first layer 110 on the package substrate 105, and a second layer 120 bonded onto the first layer 110. The first layer 110 comprises one or more electronic dies 112; and the second layer 120 comprises one or more photonic dies 122. As shown in FIG. 1A, with the second layer 120 bonded onto the first layer 110, a photonic die 122 is bonded onto a corresponding electronic die 112 using hybrid bonds 119. The direct bonding may induce an ultra-fine pitch of less than 10 micrometers. That is, a pitch or vertical distance between the electronic die 112 and the corresponding photonic die 122 can be less than 10 micrometers. The electronic die 112 may include a driver for the corresponding photonic die 122, which means the electronic die 112 can send signals into the photonic die 122 for computation and processing.

As shown in FIG. 1A, the first layer 110 further includes a bottom die 114 separated from each adjacent electronic die 112 by a via 113, e.g. a through silicon via (TSV). The TSVs 113 may comprise electrically conductive paths that extend vertically through the first layer 110 and provide electrical connectivity between the second layer 120 and the package substrate 105.

The second layer 120 further includes a top die 124 bonded onto the bottom die 114 using hybrid bonds 119. In one embodiment, the pitch between the bottom die 114 and the top die 124 after bonding can be less than 10 micrometers. As shown in FIG. 1A, the top die 124 is separated from adjacent photonic dies 122 in the second layer 120. In one embodiment, the top die 124 may be a compute or processor die having a higher operation frequency than the photonic die 122.

In one embodiment, the bottom die 114 and the electronic dies 112 are fabricated in a mature node, and contain analog and chipset functions including drivers for the photonic dies 122. While the electronic die 112 and the photonic die 122 on top are stacked face-to-face with 3D hybrid bonding, each bottom die 114 and/or electronic die 112 can be tested earlier in the package stage to select out known good dies.

As shown in FIG. 1A, the first layer 110 is attached to the package substrate 105 with bumps 109, e.g. using a flip-chip (C4) interconnection method. The package substrate 105 may be further coupled to a printed circuit board (PCB) with package bumps 101. In one embodiment, the TSVs 113 may comprise electrically conductive paths that extend vertically to provide electrical connectivity between the top die 124 in the second layer 120 and the bumps 109 on the package substrate 105.

As shown in FIG. 1A, the package 100 further comprises a pedestal 118 adjacent to each electronic die 112 in the first layer 110. The pedestal 118 is formed on the package substrate 105. The package 100 further comprises a polymer lens 128 deposited onto each pedestal 118. Each polymer lens 128 is aligned to a corresponding photonic die 122 in the second layer 120, and configured to guide light in or out of the photonic die 122.

As shown in FIG. 1A, the package 100 further comprises an optical fiber 121 aligned and attached to each polymer lens 128, to guide the light in or out of the polymer lens 128 through an edge coupler or a grating coupler which may be located within the polymer lens 128. The polymer lens 128 is disposed at a position to couple the light transmission between the optical fiber 121 and the photonic die 122. In one embodiment, an edge coupler or grating coupler is located between the optical fiber 121 and the polymer lens 128. In another embodiment, an edge coupler or grating coupler is located between the polymer lens 128 and the photonic die 122. In another embodiment, one edge coupler or grating coupler is located between the optical fiber 121 and the polymer lens 128; and another edge coupler or grating coupler is located between the polymer lens 128 and the photonic die 122.

As shown in FIG. 1A, the package 100 further comprises a heat spreader 130 formed on and in contact with the second layer 120. The heat spreader 130 comprises a plurality of thermal breaks 132 each of which is located between the top die 124 and a photonic die 122 adjacent to the top die 124. The insulating thermal breaks 132 can avoid or reduce heat transfer between the top die 124 and the adjacent photonic die 122. According to various embodiments, while the heat spreader 130 may be made of a heat conductive material, e.g. copper, silver, aluminum, etc.; the thermal breaks 130 may be made of a thermal isolation material, e.g. a porous film, a wax film, a die attach film (DAF), an aerogel, a tape, a solder paste, an adhesive, and/or a thermal grease.

Figure 1B:
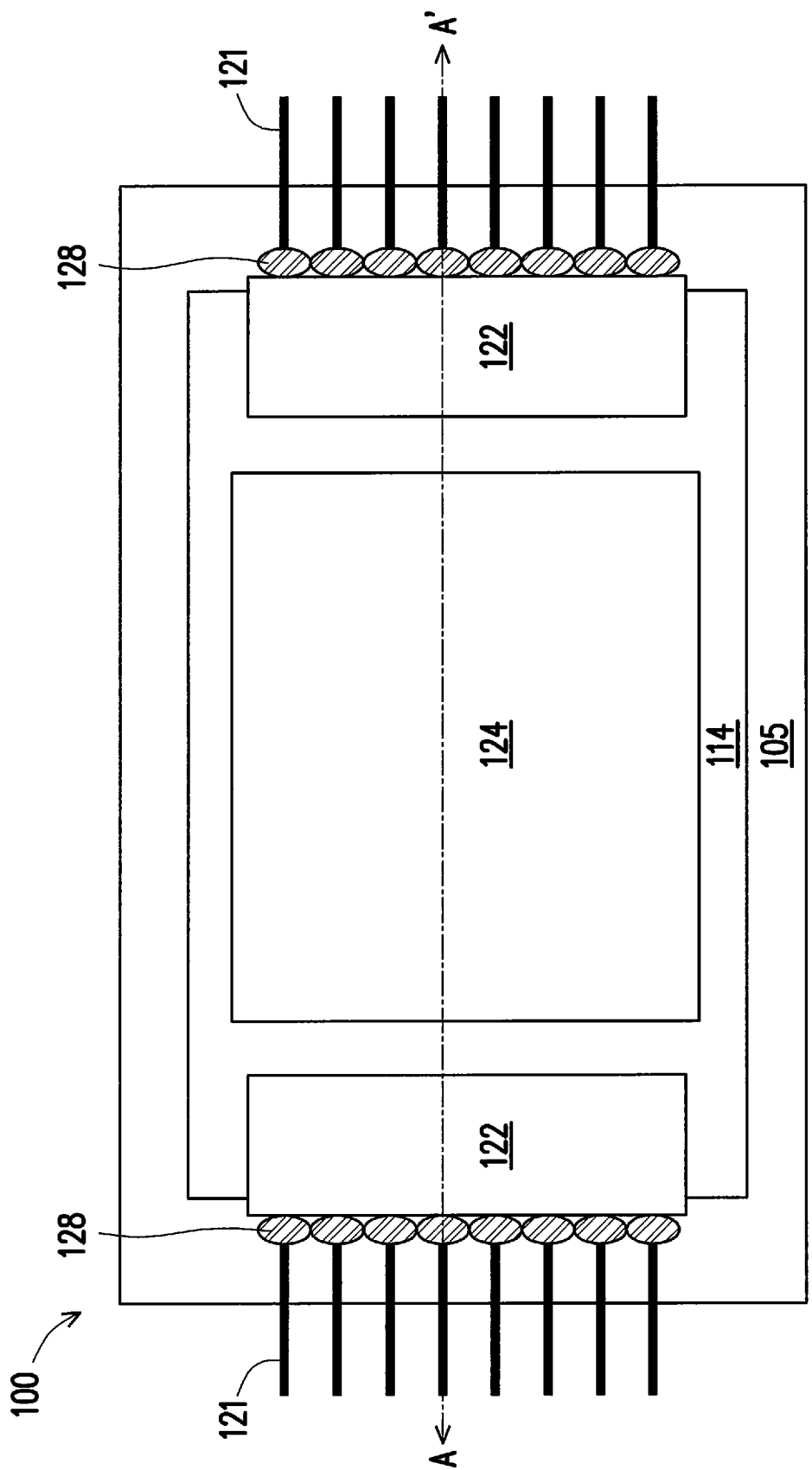
FIG. 1B illustrates a top view of an exemplary IC package, in accordance with some embodiments of the present disclosure.

FIG. 1B illustrates a top view of the exemplary IC package 100, in accordance with some embodiments of the present disclosure. The cross-sectional view of the package 100 in FIG. 1A is taken along the A-A' direction as shown in FIG. 1B. As shown in FIG. 1B, the package 100 comprises a plurality of lens arrays each of which comprises multiple lenses 128 and is aligned to a corresponding photonic die 122 in the second layer or the top layer. The package 100 comprises a plurality of fiber arrays each of which comprises multiple optical fibers 121 attached to a corresponding lens array. Each optical fiber 121 can be a single-mode or a multi-mode optical fiber. As shown in FIG. 1B, the number of the lenses 128 is the same as the number of optical fibers 121, such that each optical fiber is aligned and attached to a corresponding lens 128, which is configured to guide light transmission between the corresponding photonic die 122 and the corresponding optical fiber 121.

During operation, optical signals received from a remote server attached on one end of the optical fiber array can be coupled through the lens array to the corresponding photodetectors on the photonic die 122. Alternatively, optical signals received from a light source die or a light source in the photonic die 122 can be coupled through the lens array to the optical fiber array which can be further transmitted to the remote server.

In some embodiments, each photonic die 122 may comprise components (not shown) such as a laser driver, digital control circuit, photodetectors, waveguides, small form-factor pluggable (SFP) transceiver, High-speed phase modulator (HSPM), calibration circuit, distributed Mach-Zehnder Interferometer (MZI), grating couplers, light sources, (i.e., laser), etc. A grading coupler enables the coupling of optical signals between the optical fiber array and the corresponding photodetectors on the photonic die 122. Each grating coupler may comprise a plurality of gratings and a waveguide with designs to reduce refractive index contrast to reduce back reflection losses.

In some embodiments, each electronic die 112 may comprise circuits (not shown) including amplifiers, control circuit, digital processing circuit, at least one electronic circuit that provides the required electronic function of the package 100, and driver circuits for controlling elements in the corresponding photonic die 122.

In some embodiments, the top die 124 may comprise components (not shown) such as a CPU, a GPU, an artificial intelligence (AI) processor, a machine learning (ML) processor, a high bandwidth memory (HBM), a cache, and/or other components with a high operation frequency. In some embodiments, the bottom die 114 may comprise components (not shown) such as an I/O buffer, a chipset, a memory controller, a driver circuit, and/or other components with a low operation frequency. Each component during circuit design can be put into either a top die or a bottom die of the package, depending on different criteria. In various embodiments, compared to a component in the bottom die, each component in the top die has at least one of: a higher operation frequency, a higher clock frequency, a greater circuit area scaling capability (which means easier to scale down or reduce the circuit area and die area in future technology generations), or a higher memory speed. As such, the package 100 integrates heterogeneous types of photonic or electronic elements with a 3D hybrid bonding.

Figure 2A:
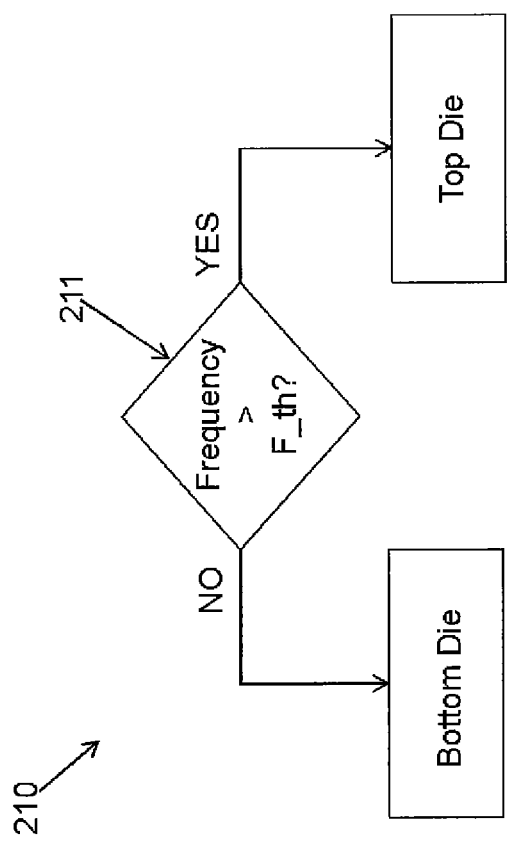
FIG. 2A illustrates an exemplary decision criterion on die selection for a photonic or electronic element, in accordance with some embodiments of the present disclosure.

FIG. 2A illustrates an exemplary decision criterion on die selection for a photonic or electronic element, in accordance with some embodiments of the present disclosure. As shown in FIG. 2A, the operation frequency of an element is compared to a frequency threshold F_th at step 211. When the operation frequency is larger than the frequency threshold F_th, the element is put into the top die. Otherwise, when the operation frequency is not larger than the frequency threshold F_th, the element is put into the bottom die. According to various embodiments, the frequency threshold F_th may be selected between 2 GHz and 4 GHz.

Figure 2B:
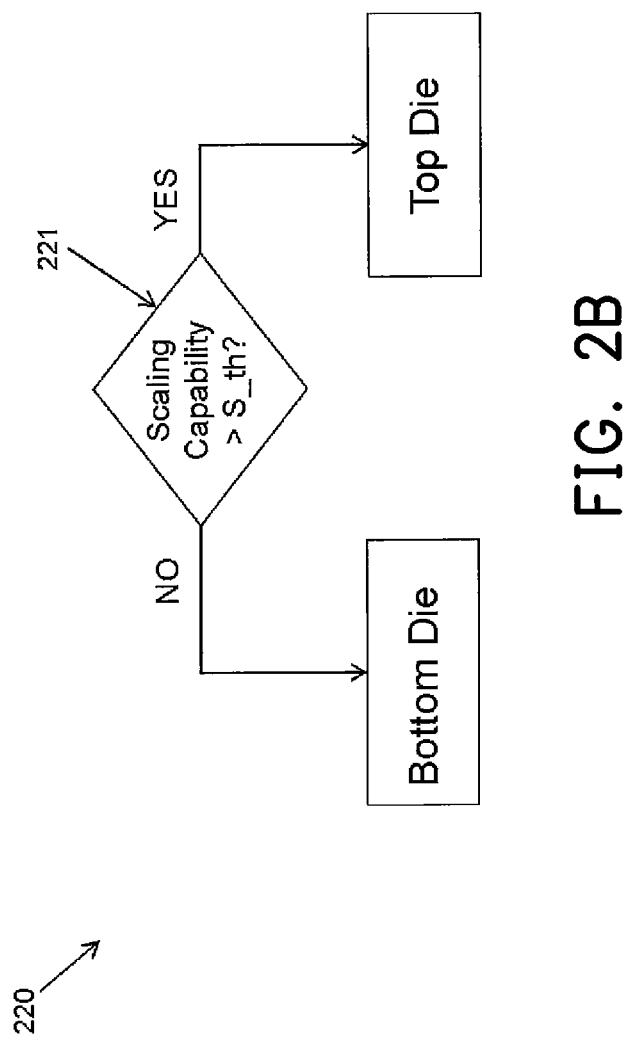
FIG. 2C illustrates yet another exemplary decision criterion on die selection for a photonic or electronic element, in accordance with some embodiments of the present disclosure.

FIG. 2B illustrates another exemplary decision criterion on die selection for a photonic or electronic element, in accordance with some embodiments of the present disclosure. As shown in FIG. 2B, the scaling capability of an element is compared to a scaling threshold S_th at step 221. When the scaling capability is larger than the scaling threshold S_th, the element is put into the top die. Otherwise, when the scaling capability is not larger than the scaling threshold S_th, the element is put into the bottom die. In one embodiment, if the element scales from one generation to another, the element is put into the top die; otherwise, the element is put into the bottom die.

FIG. 2C illustrates yet another exemplary decision criterion on die selection for a photonic or electronic element, in accordance with some embodiments of the present disclosure. As shown in FIG. 2C, the memory speed of an element is compared to a threshold M_th at step 231. When the memory speed is larger than the threshold M_th, the element is put into the top die. Otherwise, when the memory speed is not larger than the threshold M_th, the element is put into the bottom die. According to various embodiments, the threshold M_th is 2 GHz.

Figure 3C:
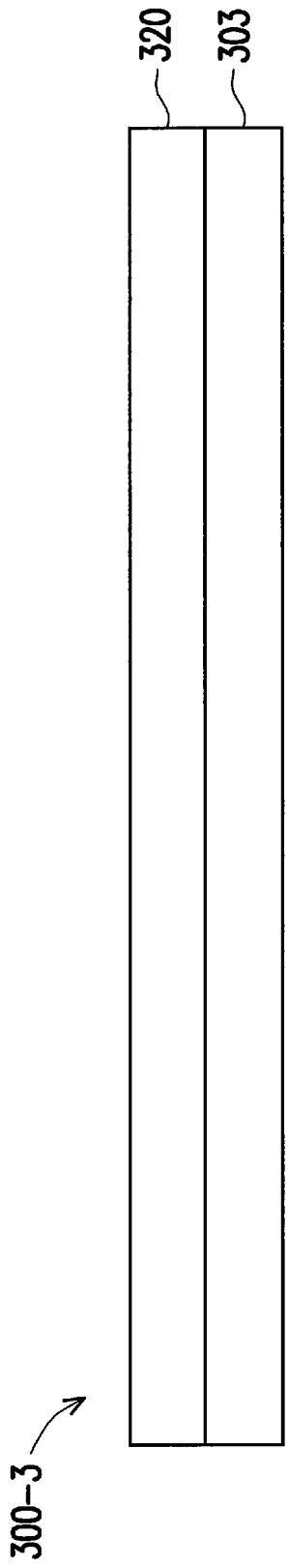

FIGS. 3A-3L illustrate cross-sectional views of an exemplary IC package at various stages of a fabrication process, in accordance with some embodiments of the present disclosure. FIG. 3A is a cross-sectional view of the package 300-1 including a first substrate 302 and a first layer 310 disposed on the first substrate 302, at one of the various stages of fabrication, according to some embodiments of the present disclosure. The first layer 310 may be formed of silicon or another semiconductor material.

FIG. 3B is a cross-sectional view of the package 300-2 including a bottom die 314 and two electronic dies 312 formed in the first layer 310 on the first substrate 302, at one of the various stages of fabrication, according to some embodiments of the present disclosure. While one bottom die and two electronic dies are shown in FIG. 3B, other numbers of the bottom dies and/or electronic dies may be formed in the first layer 310, according to various embodiments. As shown in FIG. 3B, the bottom die 314 is separated from each adjacent electronic die 312 by a via 313. Each of the bottom die 314 and the electronic dies 312 may be formed by: defining a geometric pattern from a photomask to the first layer 310 based on photolithography; etching the first layer 310 to determine an etched region in the first layer 310 based on the geometric pattern; epitaxially growing one or more semiconductor materials in the etched region to form the bottom die or electronic die; and performing chemical mechanical polishing (CMP) to smooth the surfaces of the first layer 310. Each of the vias 313 may be formed by a wet or dry etch procedure. The first layer 310 may include elements with chipset and photonic interface functionalities. In one embodiment, all of the electronic dies 312, the bottom die 314 and the vias 313 are formed together by: defining a geometric pattern from a photomask based on photolithography; etching the first layer 310 to determine etched regions in the first layer 310 based on the geometric pattern; epitaxially growing one or more semiconductor materials in the etched regions to form the electronic dies 312, the bottom die 314 and the vias 313.

FIG. 3C is a cross-sectional view of the package 300-3 including a second substrate 303 and a second layer 320 disposed on the second substrate 303, at one of the various stages of fabrication, according to some embodiments of the present disclosure. The second layer 320 may be formed of silicon or another semiconductor material.

Figure 3D:
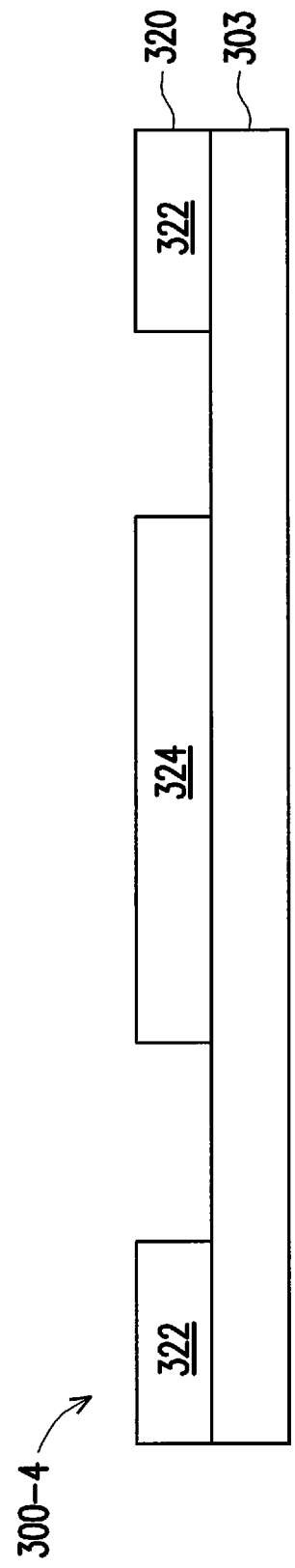

FIG. 3D is a cross-sectional view of the package 300-4 including a top die 324 and two photonic dies 322 formed in the second layer 320 on the second substrate 303, at one of the various stages of fabrication, according to some embodiments of the present disclosure. While one top die and two photonic dies are shown in FIG. 3D, other numbers of the top dies and/or photonic dies may be formed in the second layer 320, according to various embodiments. Each of the top die 324 and the photonic dies 322 may be formed by: defining a geometric pattern from a photomask to the second layer 320 based on photolithography; etching the second layer 320 to determine an etched region in the second layer 320 based on the geometric pattern; epitaxially growing one or more semiconductor materials in the etched region to form the top die or photonic die; and performing chemical mechanical polishing (CMP) to smooth the surfaces of the second layer 320. The second layer 320 may include elements with processor and photonic functionalities. In one embodiment, all of the elements including the photonic dies 322 and the top die 324 are formed together by: defining a geometric pattern from a photomask based on photolithography; etching the second layer 320 to determine etched regions in the second layer 320 based on the geometric pattern; epitaxially growing one or more semiconductor materials in the etched regions to form the photonic dies 322 and the top die 324. In one embodiment, some thermal isolation material may be inserted in the gaps between the photonic dies 322 and the top die 324 in the second layer 320.

Figure 3E:
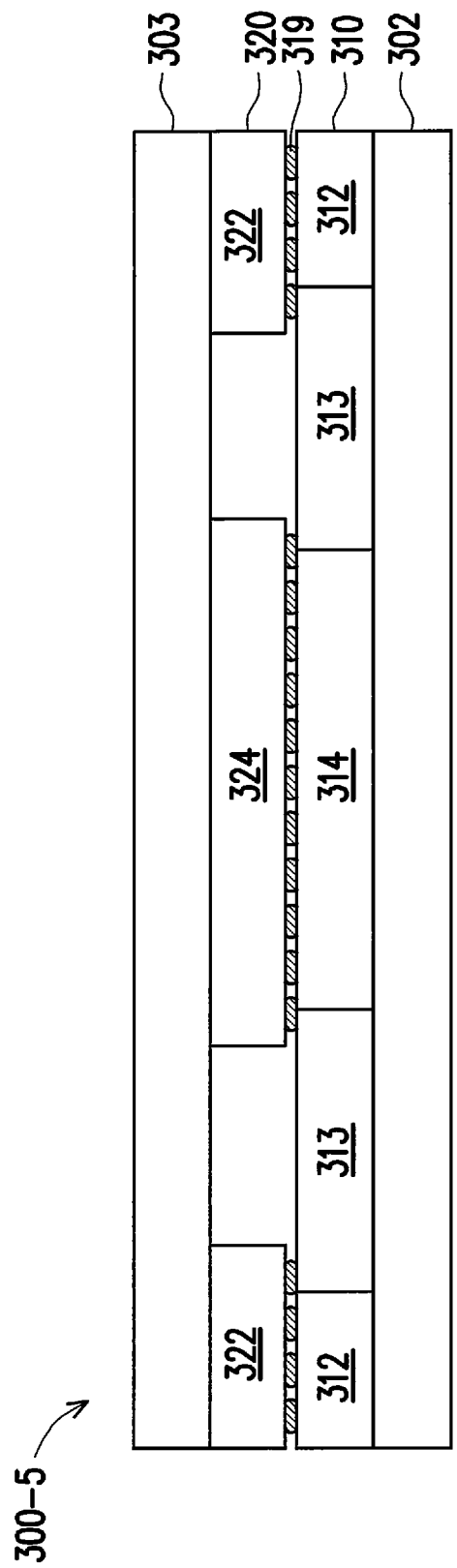

FIG. 3E is a cross-sectional view of the package 300-5 including the second layer 320 face-to-face stacked on the first layer 310, at one of the various stages of fabrication, according to some embodiments of the present disclosure. As shown in FIG. 3E, the second layer is flipped over and is bonded to the first layer via hybrid bonds 319. After the hybrid bonding, the top die 324 is bonded onto and in contact with the bottom die 314; and each photonic die 322 is bonded onto and in contact with a corresponding electronic die 312 which may include a driver circuit for controlling elements in the photonic die 322.

Figure 3F:
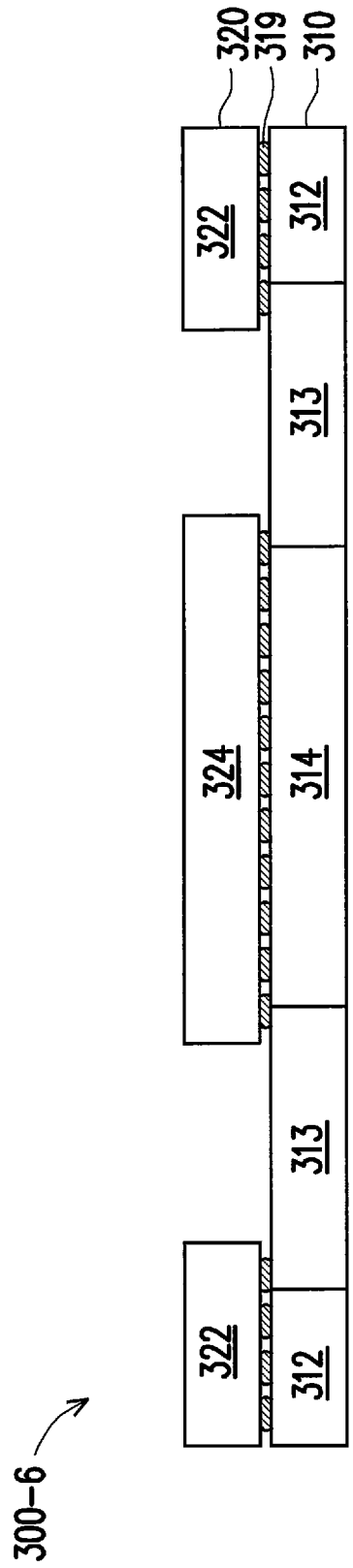

FIG. 3F is a cross-sectional view of the package 300-6, where the second substrate 303 and the first substrate 302 are removed after the bonding, at one of the various stages of fabrication, according to some embodiments of the present disclosure. This may be performed based on an etching process, a polishing process or a thinning process. The polishing process may be a chemical mechanical polishing (CMP) process. After removing the second substrate 303 and first substrate 302, the package 300-6 includes a bonded stack or bonded die.

Figure 3G:
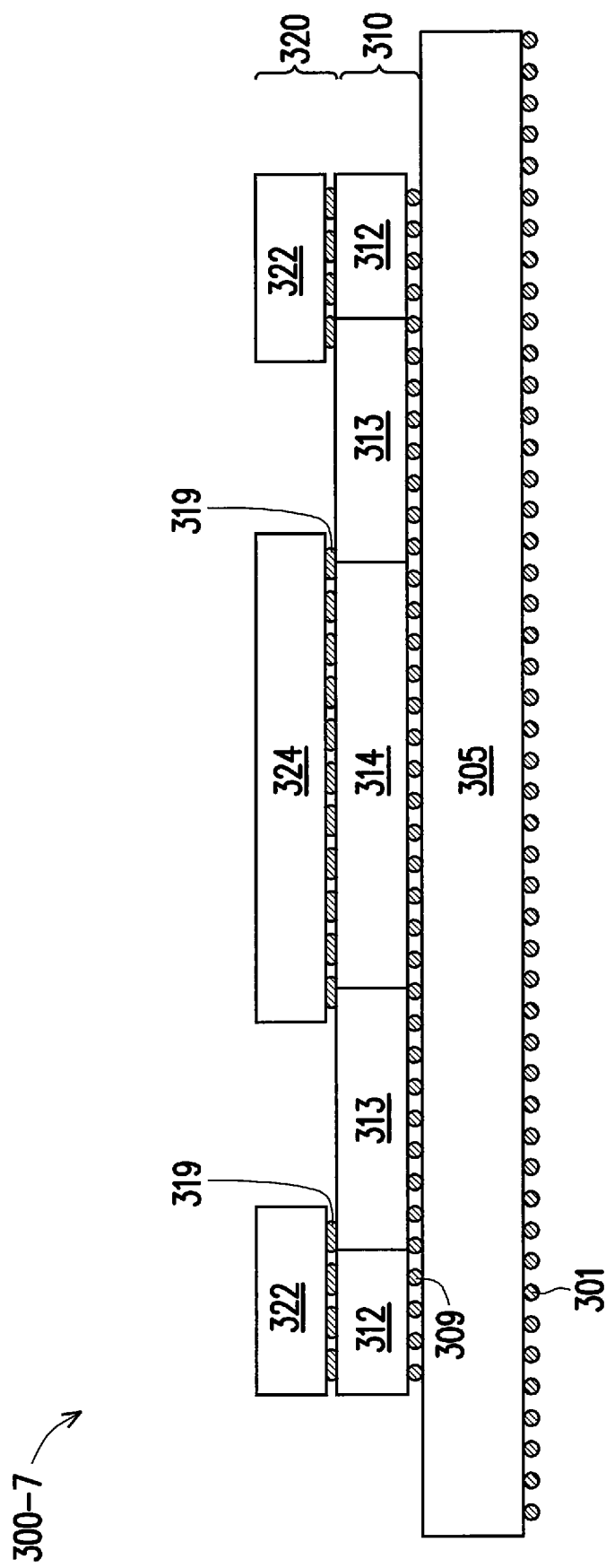

FIG. 3G is a cross-sectional view of the package 300-7, where the bonded stack or bonded die is attached to a package substrate 305, at one of the various stages of fabrication, according to some embodiments of the present disclosure. This may be performed by attaching the first layer 310 onto the package substrate 305 with bumps 309, e.g. using a flip-chip (C4) interconnection method with copper bumps. In one embodiment, the package substrate 305 may be formed of silicon oxide or another oxide material. According to various embodiments, the package substrate 305 may be coupled to a PCB board (not shown) with package bumps 301.

Figure 3H:
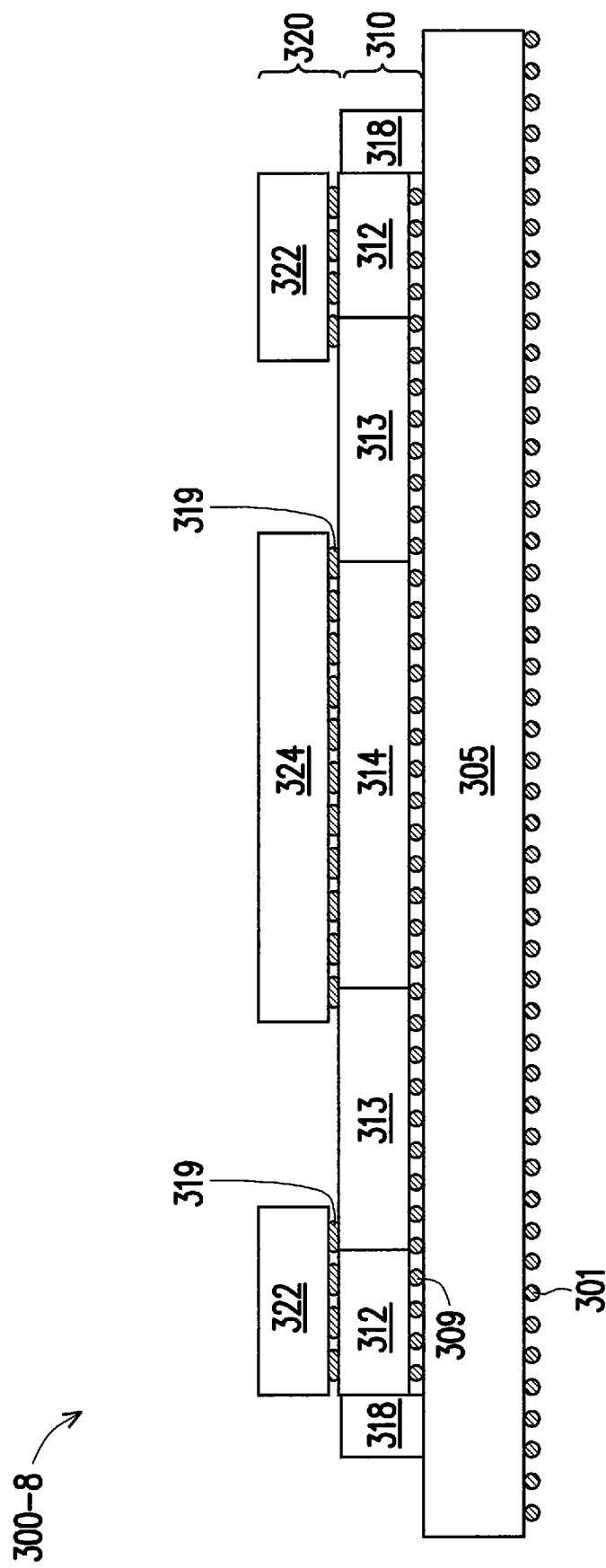

FIG. 3H is a cross-sectional view of the package 300-8, where a pedestal 318 is deposited on the package substrate 305 and adjacent to each electronic die 312 in the first layer 310, at one of the various stages of fabrication, according to some embodiments of the present disclosure. This may be performed by epitaxially growing a semiconductor material or a polymer material with a patterned photomask to form the pedestals 318.

FIG. 3I is a cross-sectional view of the package 300-9, where a lens 328 is formed onto each pedestal 318 and aligned to a corresponding photonic die 322 in the second layer 320, at one of the various stages of fabrication, according to some embodiments of the present disclosure. This may be performed by depositing one or more polymer material on each pedestal 318, to form a polymer lens 328 attached to the corresponding photonic die 322. The polymer lens 328 is aligned to the corresponding photonic die 322 at a same height, which means a light may be guided through the polymer lens 328 and into a waveguide in the photonic die 322, and from the waveguide into and through the polymer lens 328.

Figure 3J:
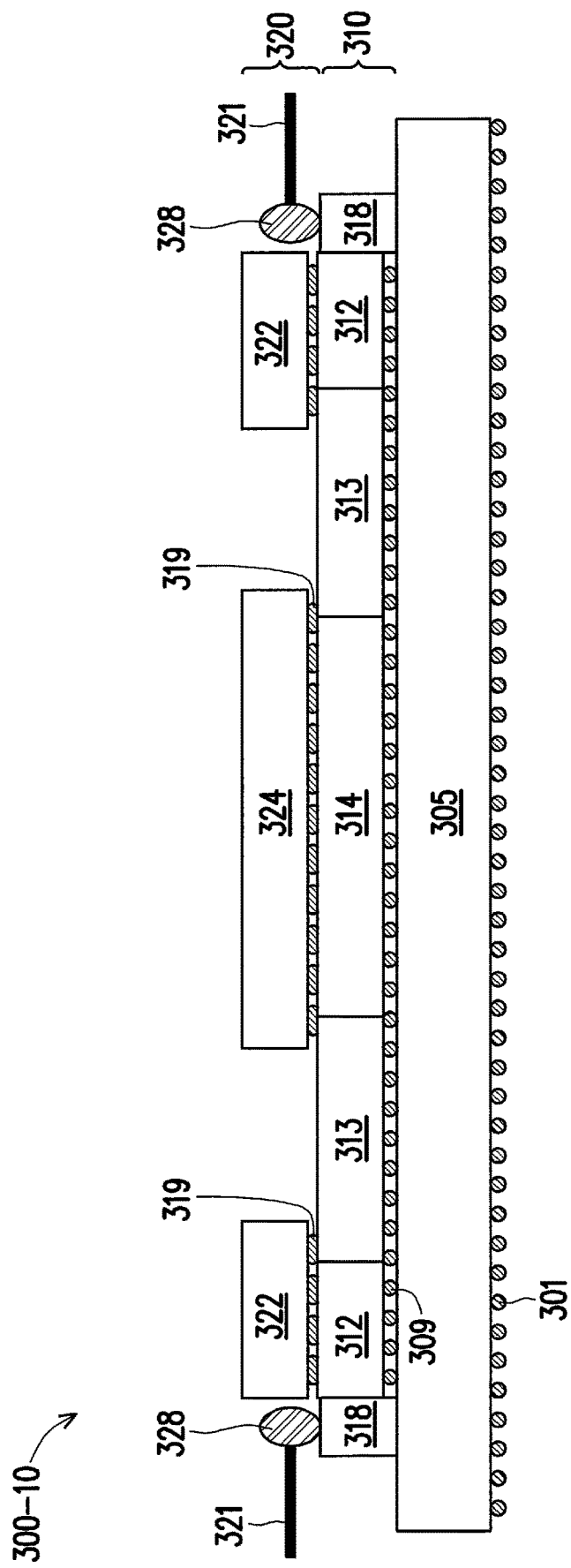

FIG. 3J is a cross-sectional view of the package 300-10, where an optical fiber 321 is attached to each polymer lens 328 in the second layer 320, at one of the various stages of fabrication, according to some embodiments of the present disclosure. This may be performed by attaching an optical fiber 321 to each polymer lens 328 with an aligned height such that a light can be guided in or out of the corresponding photonic die 322 via the lens 328 and the optical fiber 321. The polymer lens 328 is disposed at a position to couple the light transmission between the optical fiber 321 and the corresponding photonic die 322.

Figure 3K:
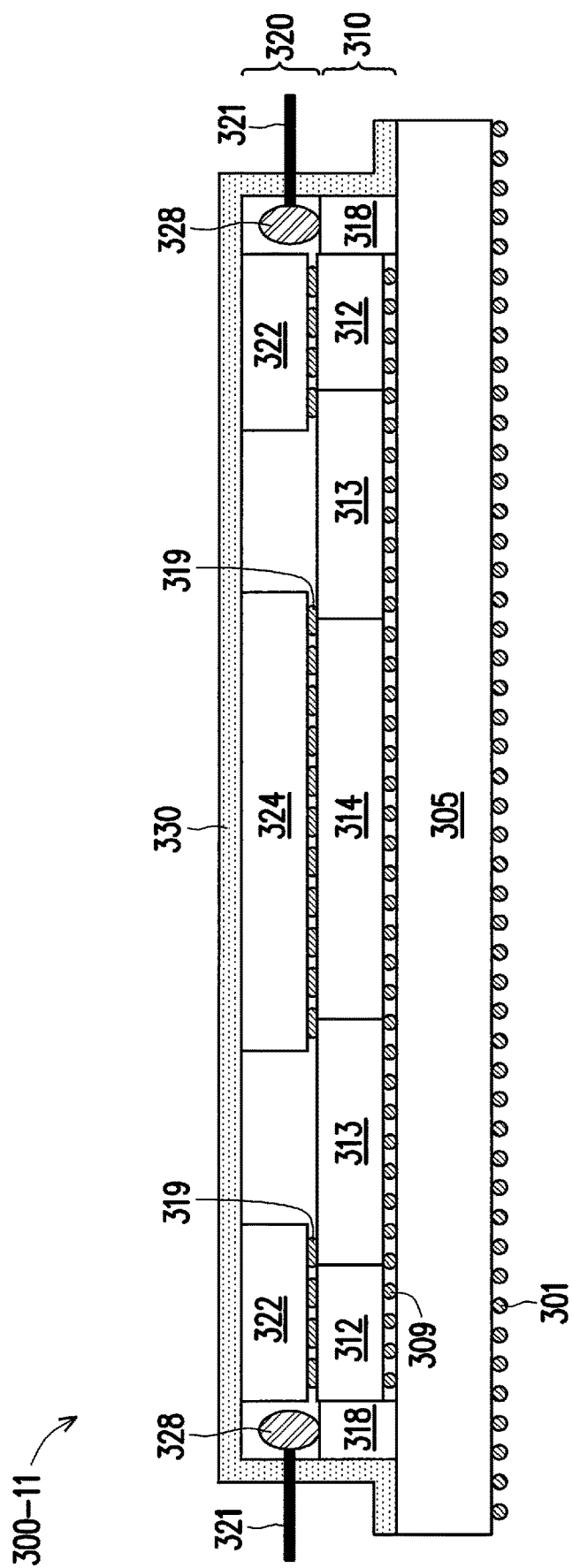

FIG. 3K is a cross-sectional view of the package 300-11, where a heat spreader 330 is deposited onto the second layer 320 and maybe partially the package substrate 305, at one of the various stages of fabrication, according to some embodiments of the present disclosure. This may be performed by depositing a heat conductive material, e.g. copper, silver or aluminum, on and in contact with the second layer 320.

Figure 3L:
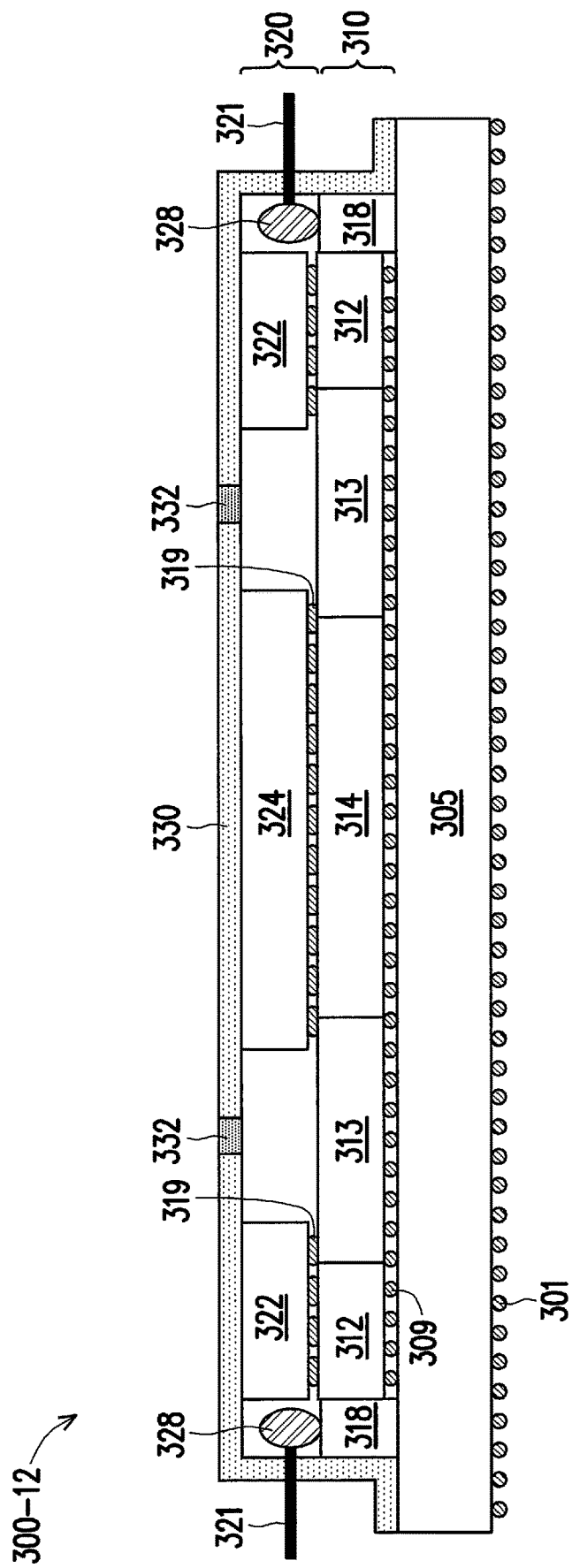

FIG. 3L is a cross-sectional view of the package 300-12, where one or more thermal breaks 332 are formed in the heat spreader 330, at one of the various stages of fabrication, according to some embodiments of the present disclosure. This may be performed by: defining a geometric pattern from a photomask to the heat spreader 330 based on photolithography; etching the heat spreader 330 to determine an etched region in the heat spreader 330; depositing a heat isolation material in the etched region to form the thermal breaks 332; and performing chemical mechanical polishing (CMP) to smooth the surfaces of the thermal breaks 332 and the heat spreader 330. As shown in FIG. 3L, at least one thermal break 332 is formed between the top die 324 and adjacent photonic die 322, to avoid or reduce heat transfer between the top die 324 and adjacent photonic die 322.

Figure 4:
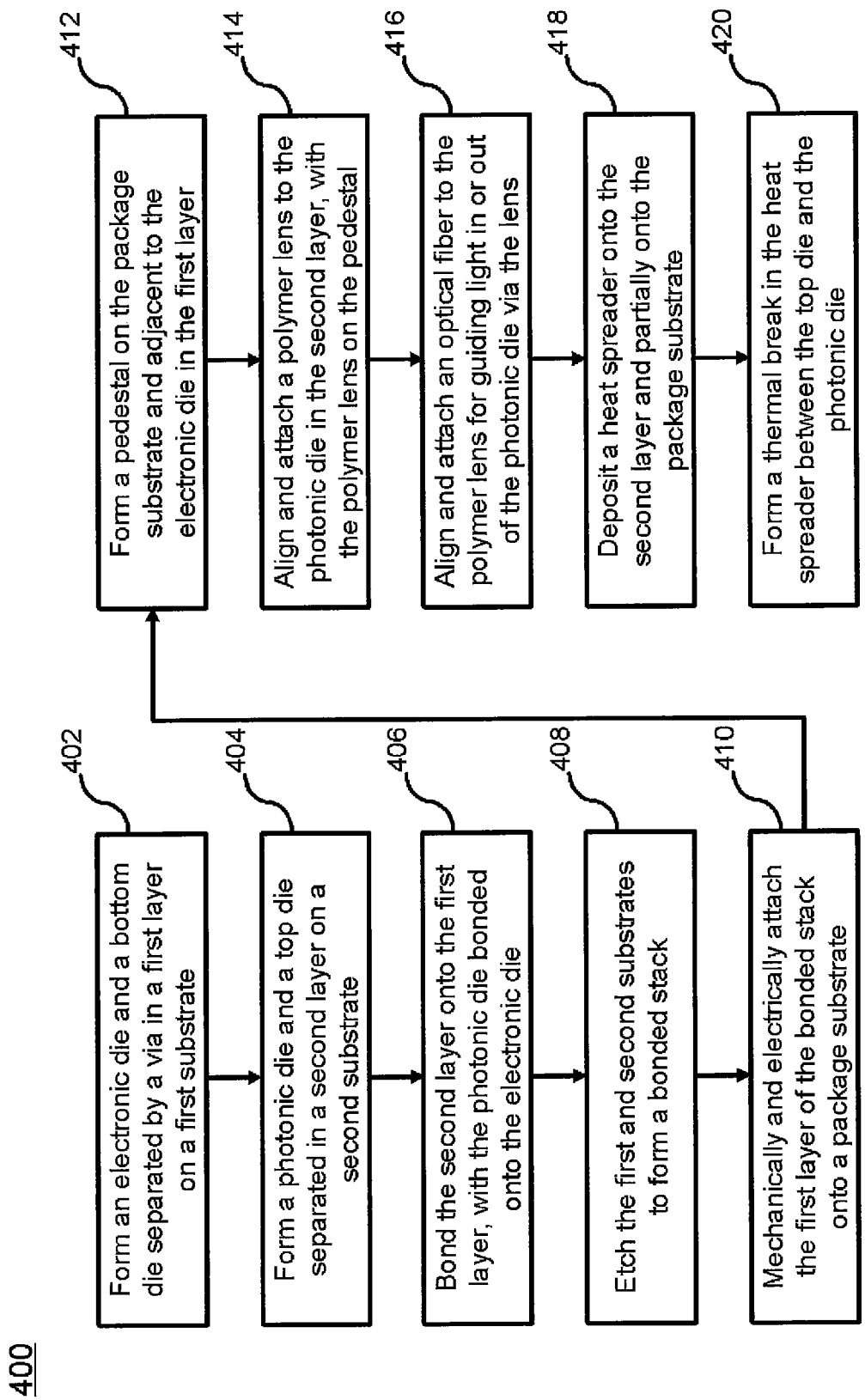
FIG. 4 illustrates an exemplary method for package integration of photonic and electronic elements, in accordance with some embodiments of the present disclosure.

FIG. 4 illustrates an exemplary method 400 for package integration of photonic and electronic elements, in accordance with some embodiments of the present disclosure. The method begins at operation 402, where an electronic die and a bottom die are formed and separated by a via in a first layer on a first substrate. At operation 404, a photonic die and a top die are formed and separated in a second layer on a second substrate. At operation 406, the second layer is bonded onto the first layer, where the photonic die is bonded onto the electronic die. The first and second substrates are etched at operation 408 to form a bonded stack. At operation 410, the first layer of the bonded stack is mechanically and electrically attached onto a package substrate.

At operation 412, a pedestal is formed on the package substrate and adjacent to the electronic die in the first layer. At operation 414, a polymer lens is aligned and attached to the photonic die in the second layer, where the polymer lens is formed on the pedestal. At operation 416, an optical fiber is aligned and attached to the polymer lens for guiding light in or out of the photonic die via the lens. As such, the polymer lens can couple the light transmission between the optical fiber and the photonic die. A heat spreader is deposited at operation 418 onto the second layer and partially onto the package substrate. At operation 420, a thermal break is formed in the heat spreader between the top die and the photonic die. The order of the operations shown in FIG. 4 may be changed according to different embodiments of the present disclosure.

Figure 5A:
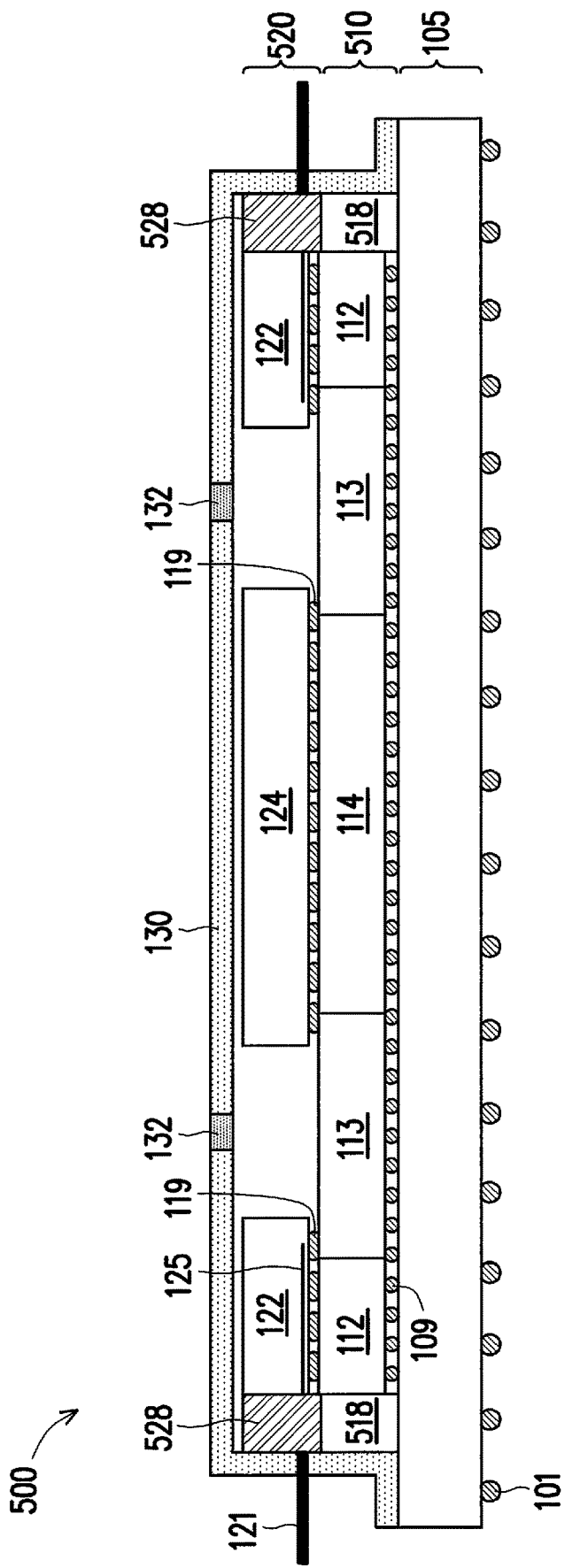
FIG. 5A illustrates a cross-sectional view of another exemplary integrated circuit (IC) package, in accordance with some embodiments of present disclosure.

FIG. 5A illustrates a cross-sectional view of another exemplary integrated circuit (IC) package 500, in accordance with some embodiments of present disclosure. It is noted that the package 500 is merely an example, and is not intended to limit the present disclosure. Accordingly, it is understood that additional functional blocks may be provided in or coupled to the package 500 of FIG. 5A, and that some other functional blocks may only be briefly described herein.

The package 500 in FIG. 5A has a similar structure to that of the package 100 in FIG. 1A, except that the package 500 includes a polymer waveguide 528, instead of a polymer lens, to be aligned and attached to the photonic die 122 in the second layer 520.

As shown in FIG. 5A, the package 500 comprises a mold 518 adjacent to each electronic die 112 in the first layer 510. The mold 518 is formed on the package substrate 105 and serves as a support for the polymer waveguide 528. In one embodiment, the mold 518 has a height between 50 and 100 micrometers. The polymer waveguide 528 is deposited onto each mold 518. Each polymer waveguide 528 is aligned to a corresponding photonic die 122 in the second layer 520, and configured to guide light in or out of the photonic die 122. In one embodiment, the polymer waveguide 528 is aligned to a silicon waveguide in the photonic die 122 in the second layer 520 and configured to guide light in or out of the silicon waveguide in the photonic die 122. The polymer waveguide may be wider than the silicon waveguide along a direction of propagation of the light. In one embodiment, each polymer waveguide 528 has a width between 2 and 10 micrometers. In one embodiment, each polymer waveguide 528 has a height between 2 and 10 micrometers.

As shown in FIG. 5A, the package 500 further comprises an optical fiber 121 aligned and attached to each polymer waveguide 528, to guide the light in or out of the polymer waveguide 528 through an edge coupler or a grating coupler which may be located within the polymer waveguide 528. In one embodiment, an edge coupler or grating coupler is located between the optical fiber 121 and the polymer waveguide 528. In another embodiment, an edge coupler or grating coupler is located between the polymer waveguide 528 and the photonic die 122. In another embodiment, one edge coupler or grating coupler is located between the optical fiber 121 and the polymer waveguide 528; and another edge coupler or grating coupler is located between the polymer waveguide 528 and the photonic die 122. The other components in the package 500 in FIG. 5A are similar to those in the package 100 in FIG. 1A.

Figure 5B:
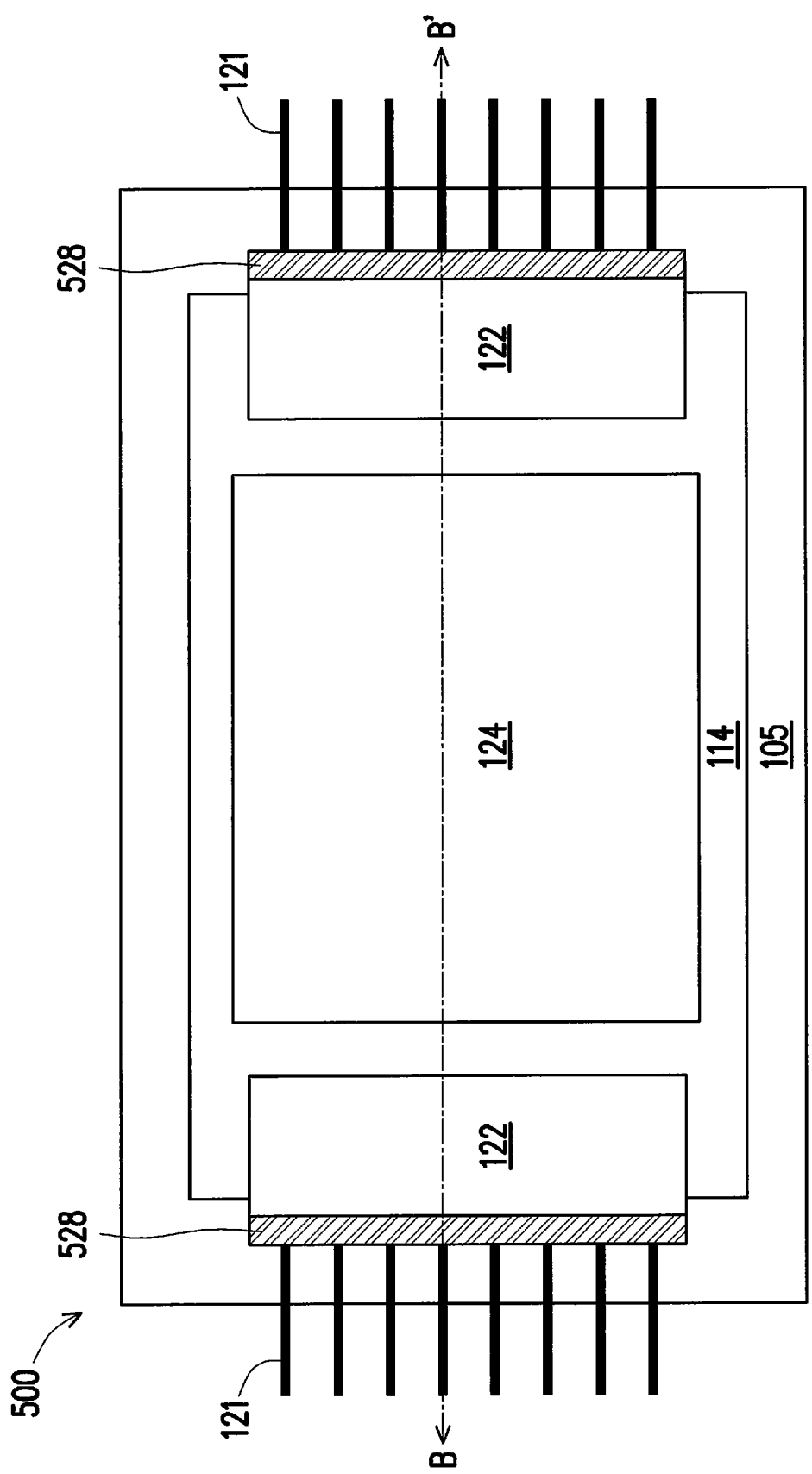
FIG. 5B illustrates a top view of another exemplary IC package, in accordance with some embodiments of the present disclosure.

FIG. 5B illustrates a top view of another exemplary IC package 500, in accordance with some embodiments of the present disclosure. The cross-sectional view of the package 500 in FIG. 5A is taken along the B-B' direction as shown in FIG. 5B. The package 500 in FIG. 5B has a similar structure to that of the package 500 in FIG. 1B, except that the package 500 includes a one-piece polymer waveguide 528, instead of a lens arrays, to be aligned and attached to each photonic die 122.

As shown in FIG. 5B, the package 500 comprises a plurality of polymer waveguides 528 each of which is aligned to a corresponding photonic die 122. In one embodiment, each polymer waveguide 528 is aligned to a silicon waveguide (not shown) in a corresponding photonic die 122 in the second layer.

The package 500 comprises a plurality of fiber arrays each of which comprises multiple optical fibers 121 and is aligned and attached to a corresponding polymer waveguide 528. Each optical fiber 121 may be a single-mode or a multi-mode optical fiber. Each polymer waveguide 528 is configured to guide light transmission between the corresponding photonic die 122 and the corresponding fiber array, or between the silicon waveguide in the corresponding photonic die 122 and the corresponding fiber array. The other components in the package 500 in FIG. 5B are similar to those in the package 100 in FIG. 1B.

FIGS. 6A-6L illustrate cross-sectional views of an exemplary IC package at various stages of a fabrication process, in accordance with some embodiments of the present disclosure. The stages shown in FIGS. 6A-6G are the same as the stages shown in FIGS. 3A-3G, and are referred to the descriptions above regarding FIGS. 3A-3G.

Figure 6E:
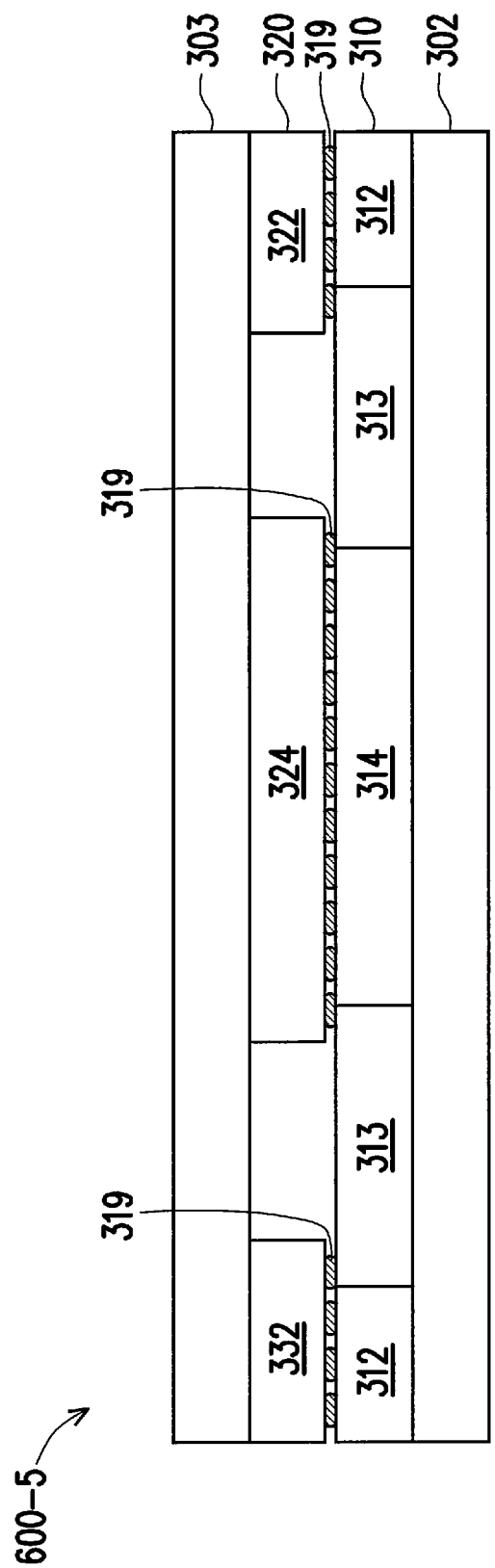
Figure 6F:
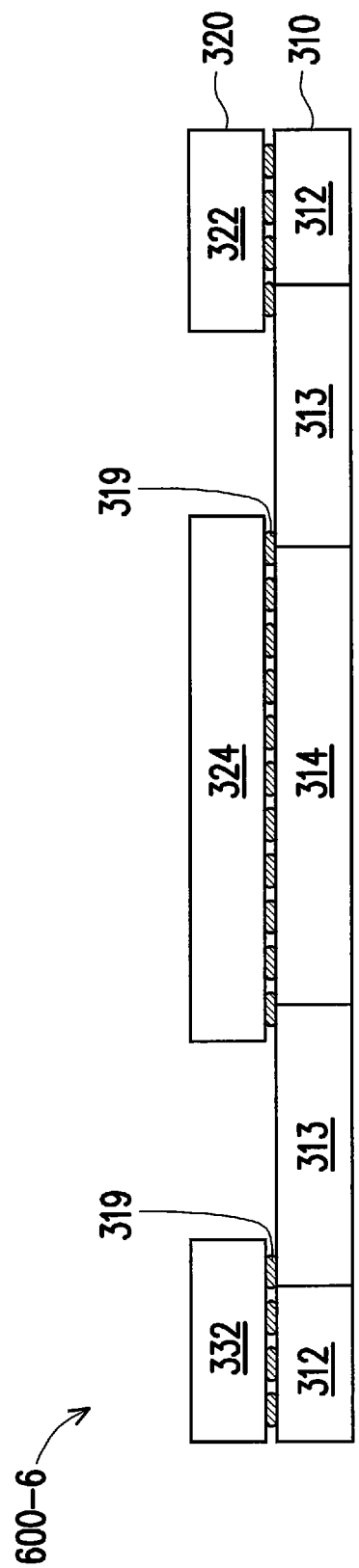
Figure 6G:
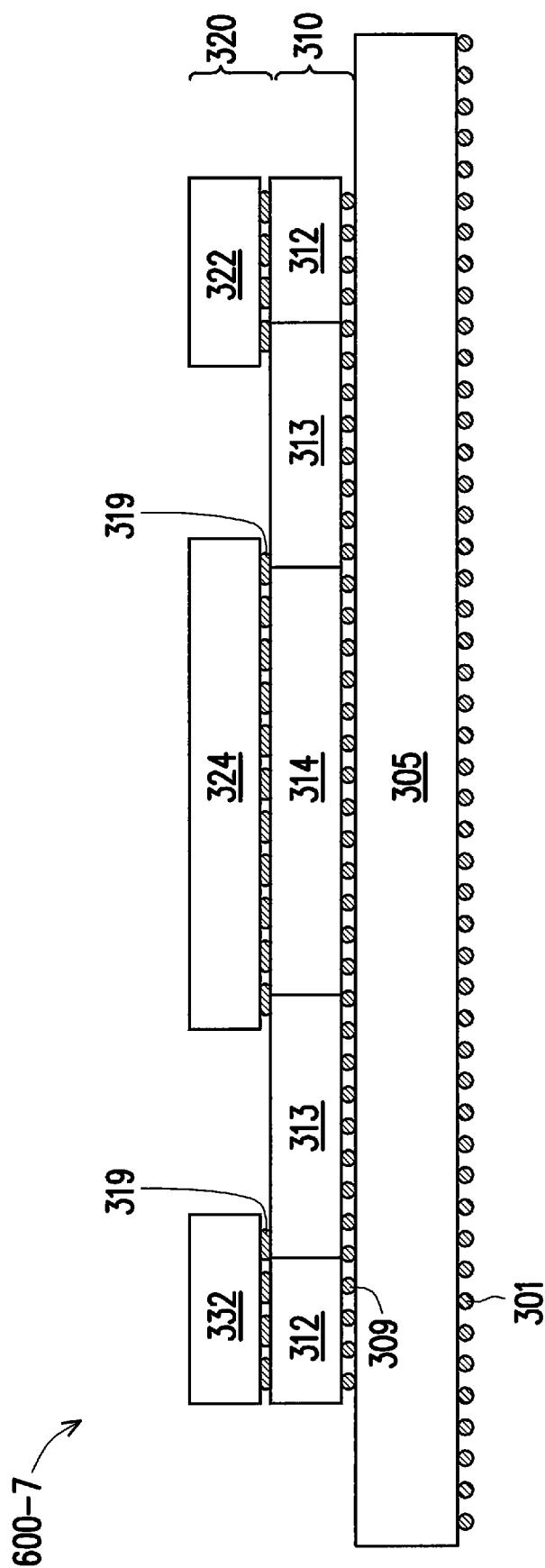
Figure 6H:
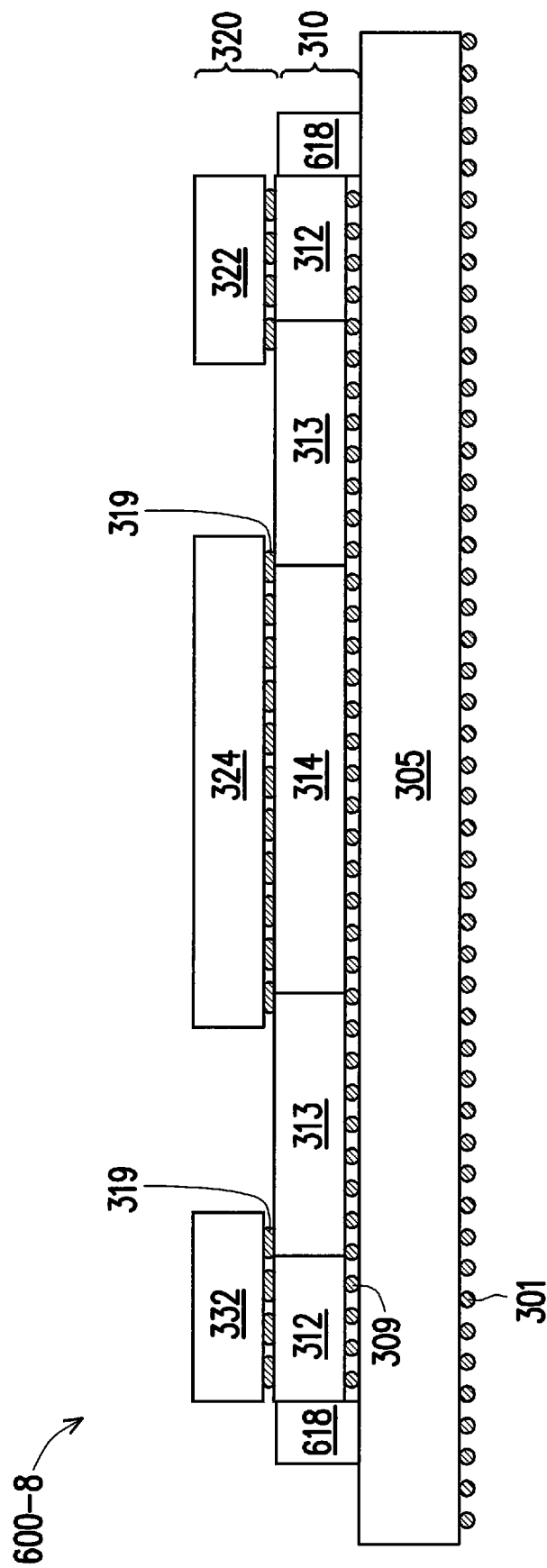

FIG. 6H is a cross-sectional view of the package 600-8, where a mold 618 is deposited on the package substrate 305 and adjacent to each electronic die 312 in the first layer 310, at one of the various stages of fabrication, according to some embodiments of the present disclosure. This may be performed by depositing a material, e.g. a silicon oxide or another glass material, with a patterned photomask to form the molds 618.

Figure 6I:
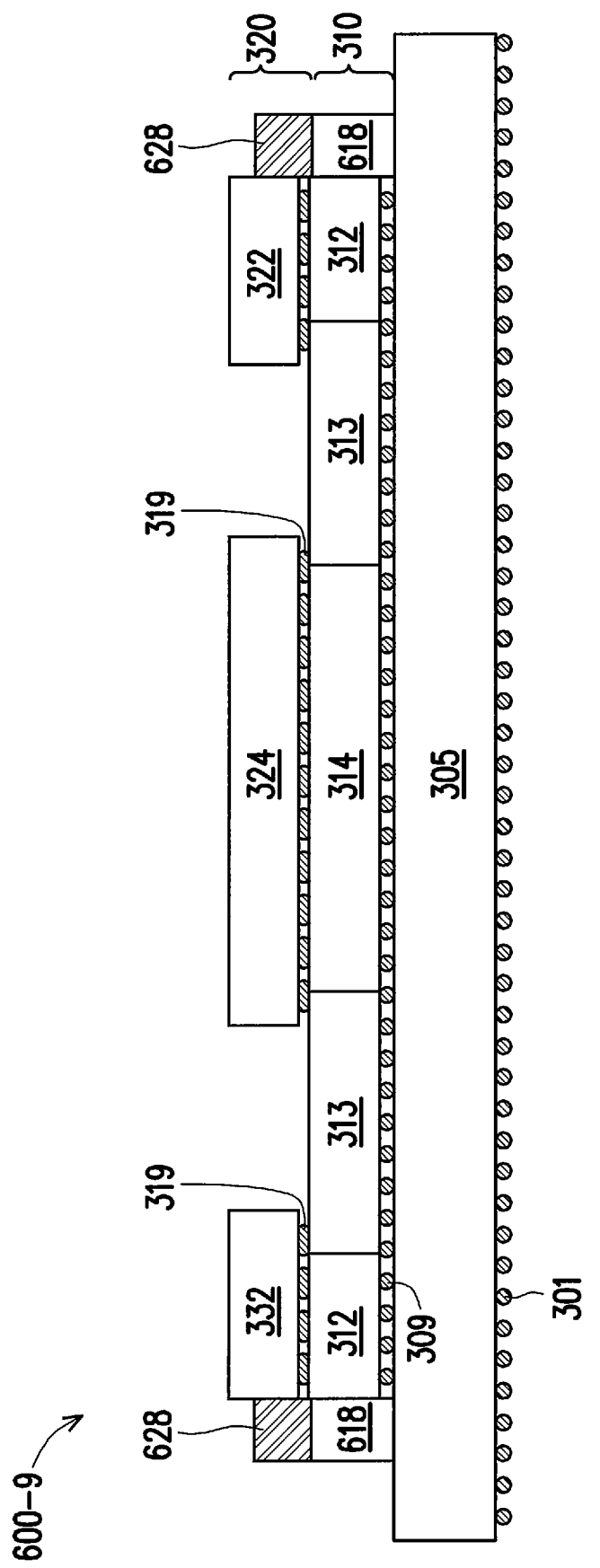

FIG. 6I is a cross-sectional view of the package 600-9, where a polymer waveguide 628 is formed onto each mold 618 and aligned to a corresponding photonic die 322 in the second layer 320, at one of the various stages of fabrication, according to some embodiments of the present disclosure. This may be performed by depositing one or more polymer material (e.g. a silicon polymer) on each mold 618, to form a polymer waveguide 628 attached to the corresponding photonic die 322. The polymer waveguide 628 may be aligned to the corresponding photonic die 322 at a same height, which means a light may be guided through the polymer waveguide 628 and into a silicon waveguide in the photonic die 322, and/or from the silicon waveguide into and through the polymer waveguide 628.

Figure 6J:
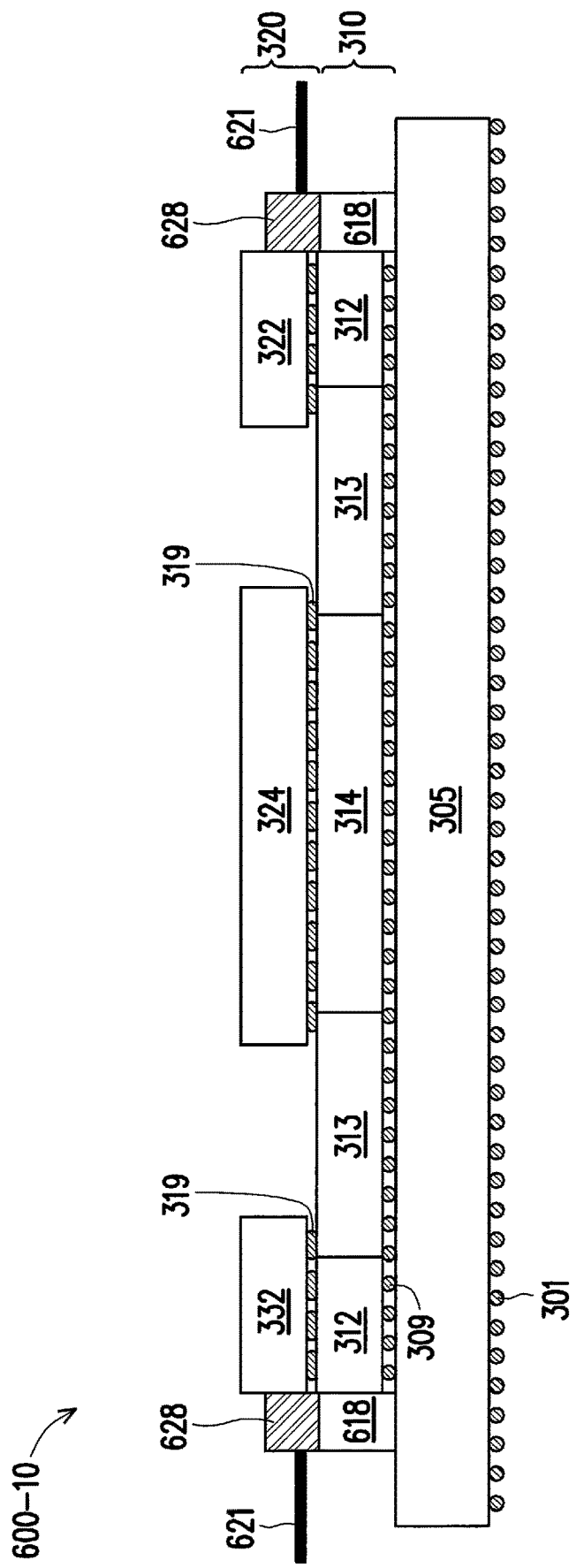

FIG. 6J is a cross-sectional view of the package 600-10, where a fiber array 621 is attached to each polymer waveguide 628 in the second layer 320, at one of the various stages of fabrication, according to some embodiments of the present disclosure. This may be performed by attaching a fiber array 621 to each polymer waveguide 628 with an aligned height such that lights can be guided in or out of the corresponding photonic die 322 via the polymer waveguide 628 and the fiber array 621. The polymer waveguide 628 is disposed at a position to couple the light transmission between the fiber array 621 and the corresponding photonic die 322.

Figure 6K:
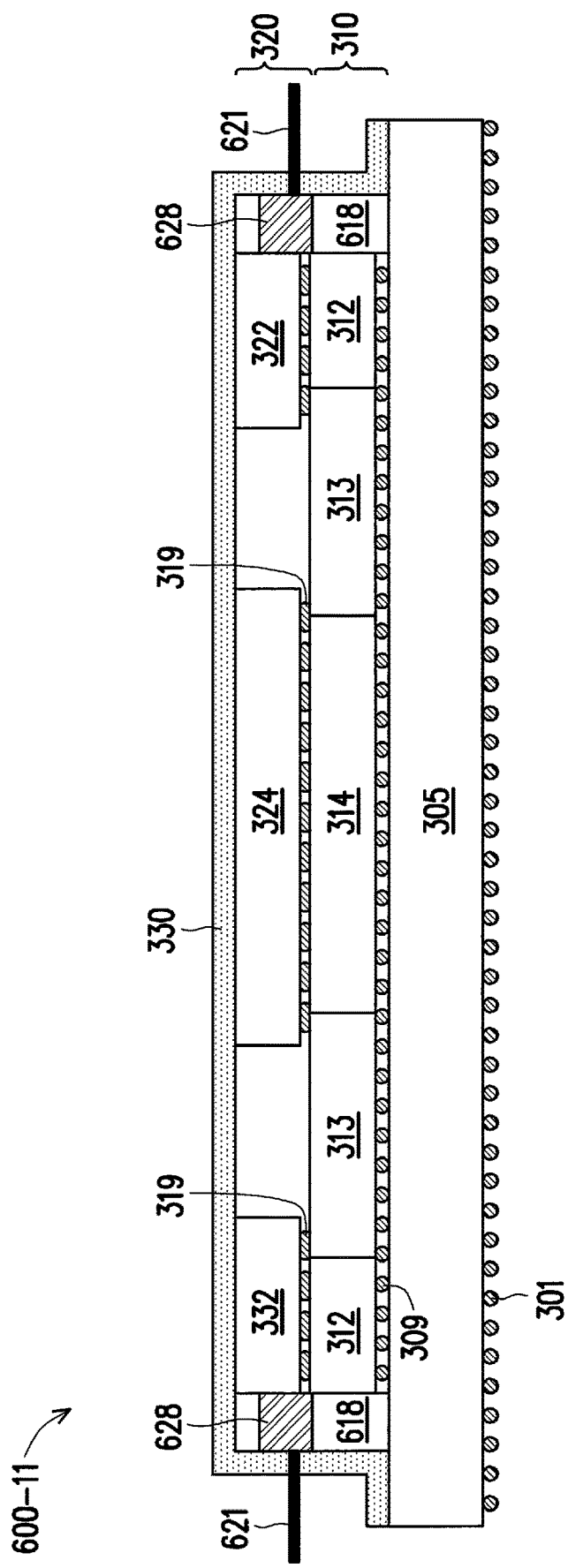

Similar to the stage shown in FIG. 3K, FIG. 6K is a cross-sectional view of the package 600-11, where a heat spreader 330 is deposited onto the second layer 320 and maybe partially the package substrate 305, at one of the various stages of fabrication, according to some embodiments of the present disclosure. This may be performed by depositing a heat conductive material, e.g. copper, silver or aluminum, on and in contact with the second layer 320.

Figure 6L:
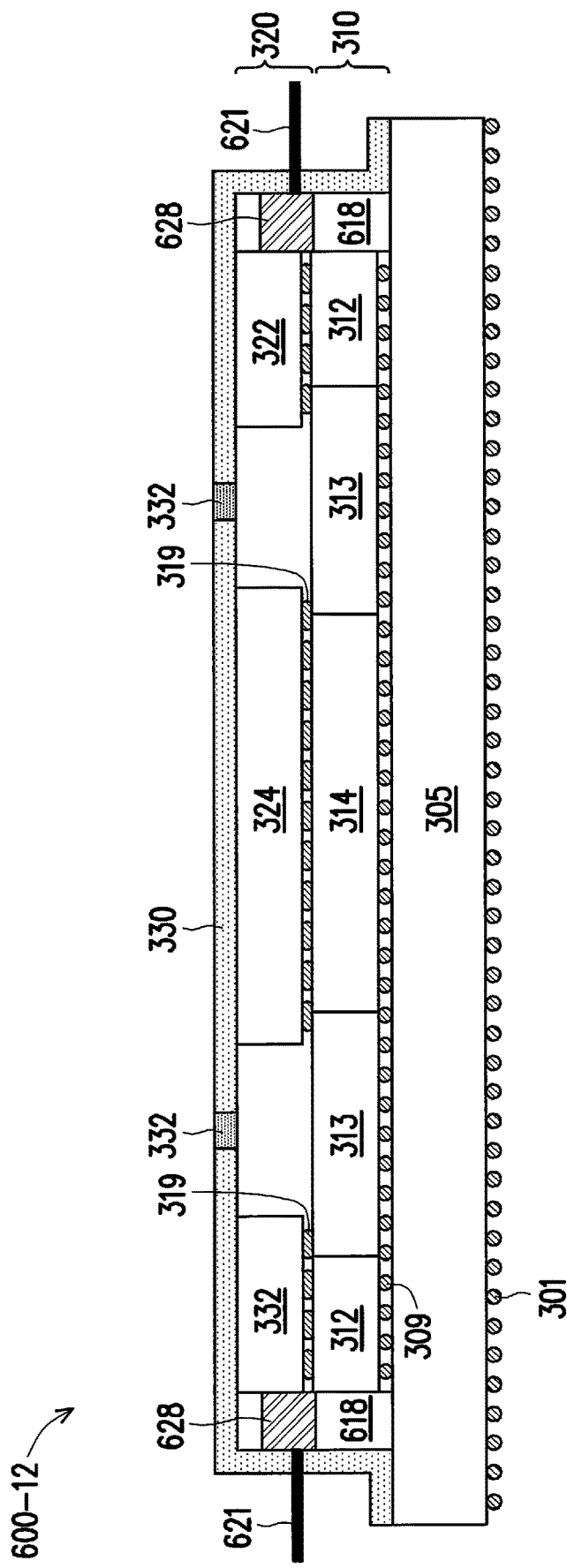

Similar to the stage shown in FIG. 3L, FIG. 6L is a cross-sectional view of the package 600-12, where one or more thermal breaks 332 are formed in the heat spreader 330, according to some embodiments of the present disclosure. As shown in FIG. 6L, at least one thermal break 332 is formed between the top die 324 and adjacent photonic die 322, to avoid or reduce heat transfer between the top die 324 and adjacent photonic die 322.

Figure 7:
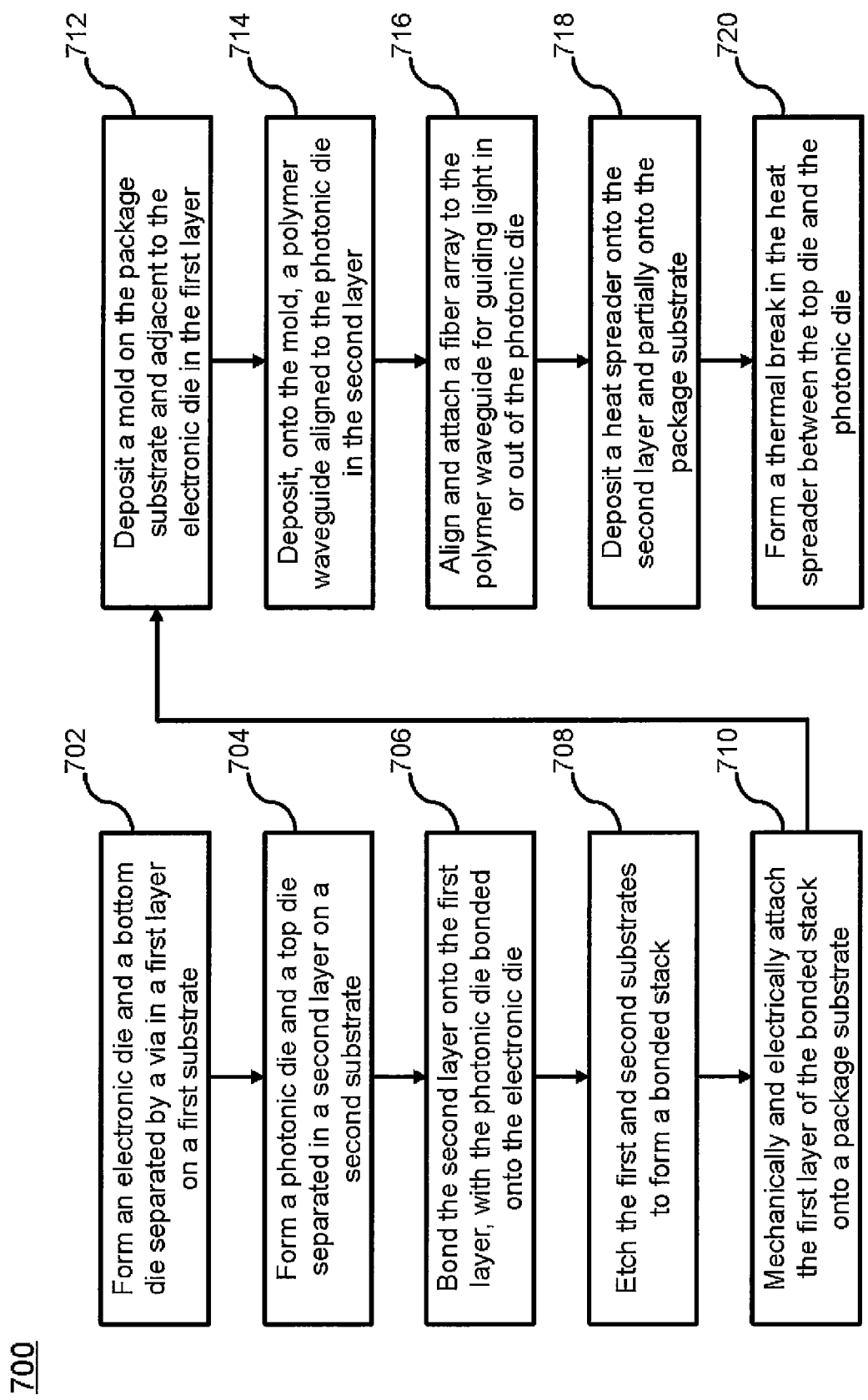
FIG. 7 illustrates another exemplary method for package integration of photonic and electronic elements, in accordance with some embodiments of the present disclosure.

FIG. 7 illustrates another exemplary method 700 for package integration of photonic and electronic elements, in accordance with some embodiments of the present disclosure. The method begins at operation 702, where an electronic die and a bottom die are formed and separated by a via in a first layer on a first substrate. At operation 704, a photonic die and a top die are formed and separated in a second layer on a second substrate. At operation 706, the second layer is bonded onto the first layer, where the photonic die is bonded onto the electronic die. The first and second substrates are etched at operation 708 to form a bonded stack. At operation 710, the first layer of the bonded stack is mechanically and electrically attached onto a package substrate.

At operation 712, a mold is deposited on the package substrate and adjacent to the electronic die in the first layer. At operation 714, a polymer waveguide is deposited onto the mold and aligned to the photonic die in the second layer. At operation 716, a fiber array is aligned and attached to the polymer waveguide for guiding light in or out of the photonic die via the polymer waveguide. As such, the polymer waveguide can couple the light transmission between the fiber array and the photonic die. A heat spreader is deposited at operation 718 onto the second layer and partially onto the package substrate. At operation 720, a thermal break is formed in the heat spreader between the top die and the photonic die. The order of the operations shown in FIG. 7 may be changed according to different embodiments of the present disclosure.

In one embodiment, a package is disclosed. The package includes: a package substrate; a first layer comprising an electronic die on the package substrate; and a second layer comprising a photonic die, wherein the second layer is bonded onto the first layer such that the photonic die is bonded onto the electronic die.

In another embodiment, a device is disclosed. The device includes: a substrate; a first layer comprising a plurality of electronic dies on the substrate; and a second layer comprising a plurality of photonic dies on the first layer, wherein each of the plurality of photonic dies is on and in contact with a corresponding one of the plurality of electronic dies.

In yet another embodiment, a method for forming a semiconductor device is disclosed. The system includes: forming a first layer comprising an electronic die; forming a second layer comprising a photonic die, wherein the electronic die comprises at least one driver for the photonic die; bonding the second layer onto the first layer to generate a bonded stack, wherein the photonic die is bonded onto the electronic die; and mechanically and electrically attaching the bonded stack onto a package substrate using conductive bumps, wherein the first layer is attached to the package substrate with the conductive bumps.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
a package substrate;
a first layer comprising an electronic die and a bottom die on the package substrate;
a second layer comprising a photonic die and a top die, wherein the second layer is bonded onto the first layer such that a bottom surface of the photonic die is bonded onto a top surface of the electronic die, wherein the top die comprises a first component that operates at a first operation frequency and the bottom die comprises a second component that operates at a second operation frequency, and wherein the first operation frequency is higher than the second operation frequency;
at least one polymer lens in contact with a side surface of the photonic die; and
at least one optical fiber optically coupled to the at least one polymer lens.

2. The package of claim 1, wherein:
the electronic die comprises a driver for the photonic die; and
the at least one optical fiber is configured to transmit an optical signal from an external source through the polymer lens to the photonic die.

3. The package of claim 1, wherein the bottom die is separated from the electronic die by a via which provides electrical connectivity between the second layer and the package substrate.

4. The package of claim 3, wherein:
the top die is bonded onto the bottom die; and
the top die is separated from the photonic die in the second layer.

5. The package of claim 4, wherein:
the bottom die comprises a first plurality of components;
the top die comprises a second plurality of components; compared to a component in the bottom die, each component in the top die has at least one of: a higher operation frequency, a higher clock frequency, a greater circuit area scaling capability, or a higher memory speed.

6. The package of claim 1, further comprising:
a pedestal adjacent to the electronic die in the first layer, wherein the polymer lens is located on the pedestal.

7. The package of claim 6, wherein the at least one polymer lens comprises a plurality of polymer lenses each in contact with the side surface of the photonic die, and the at least one optical fiber comprises a plurality of optical fibers each optically coupled to a respective one of the plurality of polymer lenses.

8. The package of claim 1, further comprising:
a polymer waveguide attached to a silicon waveguide in the photonic die in the second layer and configured to guide light in or out of the silicon waveguide in the photonic die, wherein the polymer waveguide is wider than the silicon waveguide along a direction of propagation of the light; and
a mold adjacent to the electronic die in the first layer, wherein the polymer waveguide is formed on the mold.

9. The package of claim 8, wherein:
the at least one optical fiber is attached to the polymer waveguide, to guide the light in or out of the polymer waveguide through an edge coupler or a grating coupler, wherein the polymer waveguide is disposed at a position to couple light transmission between the at least one optical fiber and the photonic die.

10. The package of claim 4, further comprising a heat spreader formed on and in contact with the second layer, wherein the heat spreader comprises a plurality of thermal breaks each of which is located between the top die and a photonic die adjacent to the top die.

11. A device, comprising:
a package substrate;
a first layer comprising a plurality of electronic dies and a bottom die disposed on the package substrate;
a second layer comprising a plurality of photonic dies and a top die, wherein the second layer is bonded onto the first layer such that a bottom surface of each of the photonic dies is bonded onto a top surface of a respective one of the plurality of electronic dies, wherein the top die comprises a first component that operates at a first operation frequency and the bottom die comprises a second component that operates at a second operation frequency, and wherein the first operation frequency is higher than the second operation frequency;
a plurality of polymer lenses in contact with a side surface of at least one of the plurality of photonic dies; and
a plurality of optical fibers optically coupled to a respective one of the plurality of polymer lenses.

12. The device of claim 11, wherein:
each of the plurality of electronic dies comprises a driver for each respective photonic die; and
each of the plurality of optical fibers is configured to transmit an optical signal from an external source through a respective one of the plurality of polymer lenses to a respective one of the plurality of photonic dies.

13. The device of claim 11, wherein the bottom die is separated from the plurality of electronic dies by a respective via which provides electrical connectivity between the second layer and the package substrate.

14. The device of claim 13, wherein:
the top die is bonded onto the bottom die; and
the top die is separated from each of the plurality of photonic dies in the second layer.

15. The device of claim 14, wherein:
the bottom die comprises a first plurality of components;
the top die comprises a second plurality of components;
compared to a component in the bottom die, each component in the top die has at least one of: a higher operation frequency, a higher clock frequency, a greater circuit area scaling capability, or a higher memory speed.

16. The package of claim 14, further comprising a heat spreader formed on and in contact with the second layer, wherein the heat spreader comprises a plurality of thermal breaks each of which is located between the top die and a photonic die adjacent to the top die.

17. A device, comprising:
a package substrate;
a first layer comprising an electronic die and a bottom die on the package substrate; and
a second layer comprising a photonic die and a top die, wherein the second layer is bonded onto the first layer such that a bottom surface of the photonic die is bonded onto a top surface of the electronic die, wherein the photonic die comprises a silicon waveguide, wherein the top die comprises a first component that operates at a first operation frequency and the bottom die comprises a second component that operates at a second operation frequency, and wherein the first operation frequency is higher than the second operation frequency;
at least one polymer lens in contact with a side surface of the photonic die; and
at least one optical fiber optically coupled to the at least one polymer lens;
a pedestal adjacent to the electronic die in the first layer, wherein the at least one polymer lens is located on the pedestal; and
a polymer waveguide attached to the silicon waveguide in the photonic die in the second layer and configured to guide light in or out of the silicon waveguide in the photonic die, wherein the polymer waveguide is wider than the silicon waveguide along a direction of propagation of the light.

18. The device of claim 17, wherein the bottom die is separated from the electronic die by a via which provides electrical connectivity between the second layer and the package substrate.

19. The device of claim 18, wherein:
the top die is bonded onto the bottom die; and
the top die is separated from the photonic die in the second layer.

20. The device of claim 19, wherein:
the bottom die comprises a first plurality of components;
the top die comprises a second plurality of components;
compared to a component in the bottom die, each component in the top die has at least one of: a higher operation frequency, a higher clock frequency, a greater circuit area scaling capability, or a higher memory speed.

* * * * *